United States Patent [19]

McDermith et al.

[11] Patent Number: 5,140,526
[45] Date of Patent: Aug. 18, 1992

[54] PARTITIONING OF BOOLEAN LOGIC EQUATIONS INTO PHYSICAL LOGIC DEVICES

[75] Inventors: William O. McDermith; Mehrdad Banki; Kevin M. Bush, all of Colorado Springs, Colo.

[73] Assignee: Minc Incorporated, Colorado Springs, Colo.

[21] Appl. No.: 294,470
[22] Filed: Jan. 6, 1989
[51] Int. Cl.$^5$ .......................................... G06F 15/60
[52] U.S. Cl. ................................ 364/488; 364/402; 364/464.01
[58] Field of Search ............... 364/200 MS File, 400, 364/402, 488, 489, 900 MS File, 464.01, 578

[56] References Cited

U.S. PATENT DOCUMENTS

| | | | |
|---|---|---|---|
| 3,617,714 | 11/1971 | Kernighan | 364/488 |
| 4,638,442 | 1/1987 | Bryant et al. | 364/489 |
| 4,701,860 | 10/1987 | Mader | 364/490 |
| 4,831,543 | 5/1989 | Mastellone | 364/489 |
| 4,835,709 | 5/1989 | Tsai | 364/513 |
| 4,896,272 | 1/1990 | Kurosawa | 364/491 |
| 4,918,614 | 4/1990 | Modarres et al. | 364/490 |
| 4,922,432 | 5/1990 | Kobayashi et al. | 364/490 |
| 4,964,056 | 10/1990 | Bekki et al. | 364/488 |
| 5,031,111 | 7/1991 | Chao et al. | 364/491 |
| 5,038,294 | 8/1991 | Arakawa et al. | 364/491 |
| 5,050,091 | 9/1991 | Rubin | 364/488 |

OTHER PUBLICATIONS

Waterman, *A Guide to Expert Systems*, Addison-Wesley Pub. Co., 1986, pp. 253-259.
*Electronic Design*, Jun. 11, 1987, Kim, "Artificial Intelligence Helps Cut ASIC Design Time" pp. 107-110.
Bergamaschi, "Automatic Synthesis and Technology Mapping of Combinational Logic", *IEEE Int. Conf. on Computer-Aided Design: ICCAD-89*, Santa Clara, CA, Nov. 7-10, 1988, pp. 466-469.
*EDN*, vol. 30, No. 11, Everett, "CAE Tools for Analog Design Are Emerging, But Breadboarding Remains Essential", p. 61 (abstract only), May 16, 1985.
Conference: *Data Processing in Design* '86, Munich, W. Germany, Oct. 28, 1986, Emberger, "CAD from Circuit Diagram to Factory Documents for the Manufacture of Printed Circuit Boards", pp. 71-86, vol. 4.
Dror et al., "Design of Electrical and Electronic Circuits Using Interactive Computer Graphics", Conference: 1977 Electrical and Electronic Engineers in Israel Tenth Convention, Tel-Aviv, Israel (Oct. 10-13, 1977).
Garrison et al., "Automatic Area Performance Optimization of Combinatorial Logic", IEEE International Conference on Computer-Aided Design, ICCAD-84, Santa Clara, CA, Nov. 12-15, 1984 (abstract).
Theeuwen et al., "Automatic Generation of Boolean Expressions in NMOS Technology", IEEE International Conference on Computer-Aided Design: ICCAD-85, Santa Clara, CA, Nov. 18-21, 1985 (abstract).
Morgan, "Model—An HDL for IC Design", Proceedings of the Third Silicon Design Conference, London, England, Jul. 15-17, 1986 (abstract).
Detjens et al., "Technology Mapping in MIS", IEEE International Conference on Computer Aided Design: ICCAD-87, Santa Clara, CA, Nov. 9-12, 1987 (abstraact).

*Primary Examiner*—Dale M. Shaw
*Assistant Examiner*—David Huntley
*Attorney, Agent, or Firm*—Dorr, Carson, Sloan & Peterson

[57] ABSTRACT

An automated system for partitioning a set of Boolean logic equations onto one or more devices selected from a plurality of commercially available devices. The system utilizes a processor having a memory containing information on the different architectural types of devices, physical device information on individual devices and user generated design constraints, weighting factors and partitioning directives. Based upon this stored information, the system of the present invention selects all acceptable architectural types of devices wherein at least one of the Boolean logic equations can be placed thereon. For all physical devices associated with the acceptable architectural types only those devices which fall within the selected user constraints are selected. The system then evaluates the weighting factors to order the devices in order of cost value and then fits the equations according to the partitioning directives to the devices. During the fitting process, an optimum device solution is attained having a least cost value for which the system produces an output map suitable for the user of the system to configure the selected devices to implement the set of equations.

8 Claims, 11 Drawing Sheets

PARTITIONING OF BOOLEAN LOGIC EQUATIONS INTO PHYSICAL LOGIC DEVICES

BACKGROUND OF THE INVENTION

1. Related Invention

The present invention is related to "Digital Waveform Analyzer", filed Jan. 11, 1988, Serial No. 07/142,652, now U.S. Pat. No. 4,873,647.

2. Field of the Invention

The present invention relates in general to a method and apparatus for partitioning Boolean equations representative of logical relationships between input and output digital signals for implementation into actual physical logic devices. More particularly, the present invention relates to a method and apparatus for performing partitioning of Boolean logic equations based upon user generated cost values, physical constraints, and pin directives into actual physical devices wherein a plurality of possible partitioning solutions are tabulated in order of cost value.

3. Statement of the Problem

In the design of digital systems, a problem exists with the incompatibility of the various components available from different manufacturers. For example, the manufacturer of a computer will specify the various input and output binary signals necessary to communicate with its computer. Likewise, the manufacturers of the peripheral devices that interconnect with the computer also provide detailed signal specifications for interconnecting the inputs and the outputs of the devices. While some manufacturers of peripheral devices specifically manufacture the device to communicate with a given processor, it is more common to design an interface circuit that allows a peripheral device to communicate with a computer or another interface device. These interface devices provide the necessary logic and timing capability. Some peripheral devices have several interface circuits for each different function they perform. This problem with compatibility is not limited to computers and digital devices but is a common problem between any digital device that must communicate with another digital device. In addition, a need exists for a system which automatically aids in the design of state machines, decoders, and the like.

The above related invention provides an automatic approach to determine the necessary Boolean logic equations for the design of such interface circuits so that a peripheral device or system is fully compatible with the computer.

A need exists, therefore, to take the Boolean logic design equations, whether manually or automatically generated, and to partition the equations into a set of physical logic devices.

Currently there exists hundreds of logic devices of different types available to a designer for implementation in digital structures. These commercially available devices include programmable devices such as programmable logic devices (PLDs), programmable logic arrays (PLAs), programmable logic elements (PLEs), programmable logic sequencers (PLS), and programmable memories (PROMs); standard logic such as 7400 series TTL, 4000 series CMOS, and 10K series ECL; standard cells; and gate arrays. It becomes confusing and difficult for logic designers to process the shear magnitude (i.e., several thousand) of commercially available devices while still paying attention to such details as propagation delays, costs, family type, etc.

Significant engineering time can be consumed to manually partition Boolean logic design equations into commercially available devices. Furthermore, manual partitioning does not guarantee that the optimum design (i.e., the lowest cost, etc.) has been achieved.

A further need exists for an automatic system wherein the user of the system can specify physical constraints such as propagation delay, logic family, etc. and wherein the user can further specify partitioning directives such as signals appearing on specific pin assignments.

4. Solution to the Problem

The present invention provides a solution to the above problem by providing an automated partitioning system for designing, on a computer, the physical implementation of Boolean logic design equations into a set of physical logic devices that meets a user's constraints, partitioning directives and design goals.

The use of such constraints, partitioning directives, and design goals enables the user to significantly reduce the time spent in evaluating architectures and devices from different manufacturers.

Furthermore, the present invention, as opposed to prior manual layout approaches, automatically generates an optimal layout of inputs and outputs on one or more devices, again, thereby significantly reducing engineering time in the overall design effort.

The present invention further solves the above problem by ordering the possible partitioning solutions according to a cost value. The present invention provides output solutions in minutes compared to manual approaches that may take weeks of engineering effort.

SUMMARY OF THE INVENTION

The automated system of the present invention selects one or more devices from a plurality of commercially available physical devices to implement a given set of Boolean logic design equations. The system of the present invention receives the Boolean equations and the following types of memory files.

A template file memory stores the different architectural types of devices wherein the template file memory contains template data containing architectural information such as type number and pin assignments.

A device information memory file is provided for storing device information corresponding to each of the plurality of different commercially available devices. The device information corresponds to one of the architectural types and further contains device data such as the identity of the device manufacturer, the device price, the propagation delays, the device logic family, etc.

An available device file is provided for storing available device information corresponding to the device information available only to the user of the system. For example, a particular user of the system of the present invention may receive special pricing from a manufacturer and these special prices can be entered into the available device file memory.

A criteria file is provided which stores selected user constraints for use by the system in partitioning the Boolean logic equations into physical devices. Examples of such user constraints would be devices below a certain price, devices having less than a given propagation delay, etc.

A partitioning file memory is provided for enabling the user to select and dictate to the system of the present invention certain partitioning directives such as pin assignments, etc.

The system of the present invention utilizes the data contained in the above files for partitioning a given set of Boolean logic design equations into the plurality of commercially available devices. In performing the partitioning, the system of the present invention is capable of selectively examining all of the commercially available devices contained in the device information memory file and to list those devices which provide a solution. The solution could be simply one device or a combination of separate devices. Furthermore, the system of the present invention orders the possible solutions in an order of cost value so that the user of the present invention can obtain a physical design having a least cost value. The user in evaluating the cost value can selectively input cost weights to the constraints in the criteria file in order to arrive at a more meaningful cost value. For example, the user may specify the price of the device and the area that the device takes up as joint cost values and, in fact, the user can assign different weights to each of these constraints.

Finally, the present invention provides the necessary mapping output information which may be a fuse map, a net list, or a wire list depending upon the nature of the device involved.

DETAILED DESCRIPTION

1. System Overview

Figure 1:
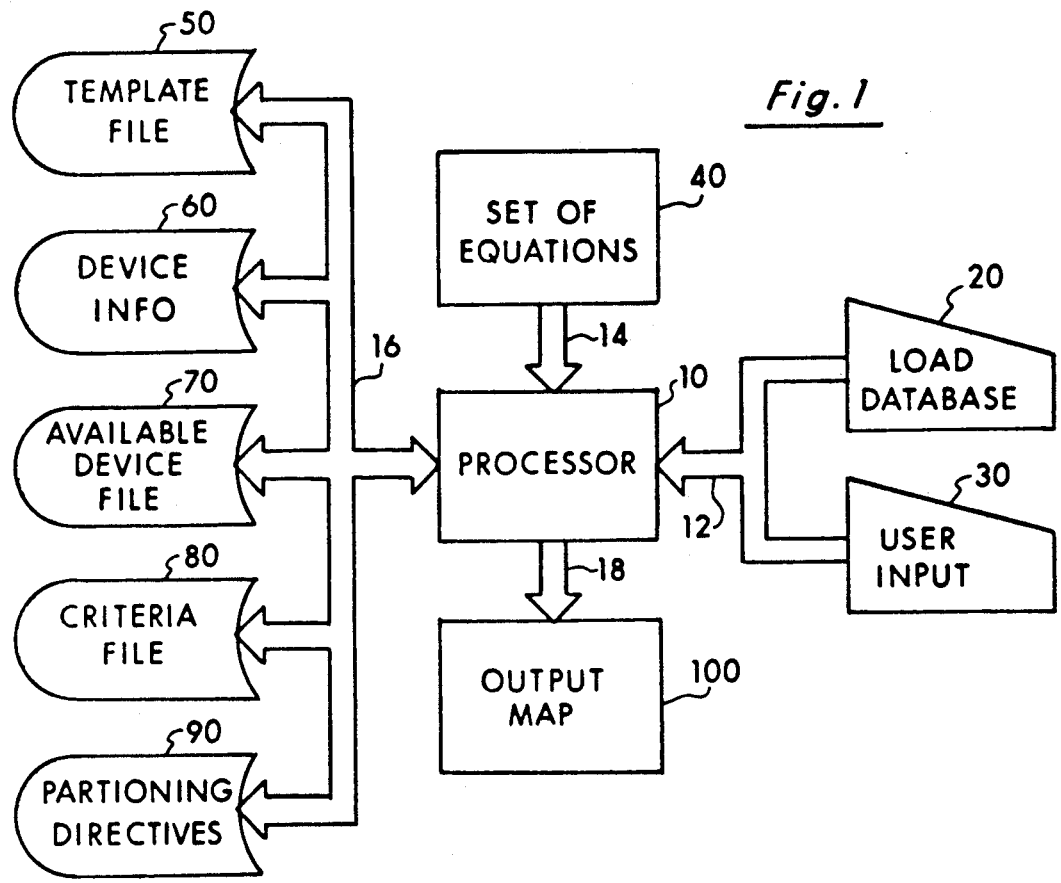
FIG. 1 illustrates the functional components of the partitioning system of the present invention.

In FIG. 1, the partitioning system of the present invention operates on conventional processors 10 such as IBM personal computers or Sun workstations. The user of the present invention is capable of loading a database 20 and inputting 30 information into processor 10 such as through floppy diskettes, keyboards, tapes, or other conventional input means. The processor 10 receives a set of equations 40 stored in memory from a source such as that, for example, described in the above identified related invention.

The processor 10 establishes and utilizes a number of memory files in memory. These memory files include a template file 50, a device information file 60, an available device file 70, a criteria file 80, and a partitioning directives file 90.

The user, through inputs 20 and 30, communicates over path 12 with the processor 10. The processor 10 receives 14 the set of equations 40 and communicates 16 with memory files 50, 60, 70, 80, and 90.

When completed with the partitioning process of the present invention, the processor 10 delivers 18 an appropriate output map 100 such as a fuse map for a programmable device, a net list for a gate array, or a wire list for standard logic.

It is to be expressly understood that the block diagram approach shown in FIG. 1 is functional and can be implemented on different computer architectures. The processor essentially utilizes an input 20 and 30, a memory 40, 50, 60, 70, 80, and 90 and an output 100 to perform the processes of the present invention.

The system 10 of the present invention is capable of partitioning a set of Boolean equations to fit on commercially available physical logic devices. The partitioning system places each output signal on a pin of a device and assigns the input signals needed in a way that minimizes a cost function associated with the design.

2. Template File 50, Device Information File 60 and Available Device File 70

Figure 2:
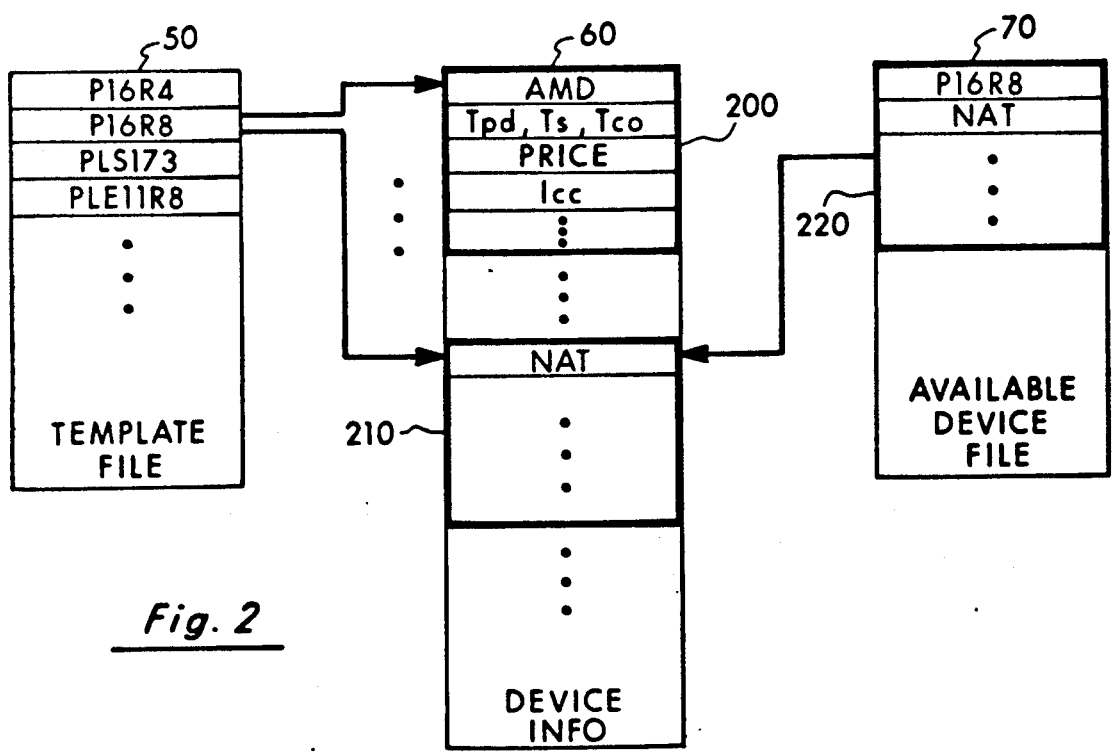
FIG. 2 illustrates the file setup and the relationships between the template file, the device information file, and the available device file of the present invention.

In FIG. 2, the details of the template file memory 50 are shown to include the generic description or name of each type of device architecture available for partitioning. For example, in file 50 of FIG. 2 are shown two PLD-type devices (the P16R4 and the P16R8), one PLA-type device (PLS173), and one PROM-type device (PLE11R8). It is to be expressly understood that the over 130 different types of commercially available logic devices could be loaded into the template file 50. The system can hold any suitable number including new future logic device technologies. The template information stored in file 50 includes the type number, the number of pins, the pin assignments, etc.

Each of these device architectures can be manufactured by a number of different manufacturers. A given device architecture could be manufactured by a number of different companies and a given company could manufacture several different models of the same device architecture. For example, Advanced Micro Devices (AMD) and National Semiconductor (NAT) each manufacture devices having the P16R8 architecture. AMD currently manufactures ten separate models having the P16R8 architecture. In the preferred embodiment, over 3,100 commercially available physical programmable or non-programmable logic devices can be contained in file 60 although the system is not limited to that amount.

Detailed information concerning each of these architectural types are contained in a device information file 60. In the example shown in FIG. 2, the P16R8 template describes the functional architecture for all P16R8 devices. Each physical logic device in the P16R8 family differs in at least one of several physical characteristics. These physical characteristics are set forth in the device information file 60. For example, two records 200 and 210 are shown in the device information file 60. Record 200 is one of the AMD P16R8 device records and record 210 is one of the National Semiconductor P16R8 device records. Hence, the identity and model number of the manufacturer of the device is stored in the device information file 60. Other device performance values and characteristics are the input to output propagation delay (i.e., the time it takes for an output that depends on an input to change once the input changes), Tpd; if the device contains a register, then the time it takes to set up the register, Ts; and the time to clock the output from the register, Tco, is also contained in record 200. Other physical characteristics are the process family for the device (i.e., TTL, ECL, GAAS or CMOS), the package that the device is placed in (DIP, PGA, or LCC, etc.), the maximum amount of current that the device uses (and hence the maximum power anticipated by the device), the size of the device (surface area), the price of the device, the operating temperature range of the device, the number of pins on package, etc. All physical characteristics concerning a particular commercially available device can be suitably stored. It is to be expressly understood that future device characteristics could be entered into file 60 under the teachings of the present invention.

The available device file 70 shown in FIG. 2 is used by the operator to override the device information file 60. This is shown in FIG. 2 wherein the user record 220 corresponding to the database record 210 (i.e., template = P16R8/Device = National Semiconductor) contains the override information.

The system of the present invention comes with a complete database as represented by files 50 and 60 which is loaded through input 20 by means of processor 10 into the template file 50 and the device information file 60. However, the users of the partitioning system of the present invention may have special prices or special specifications that they are able to obtain directly from a given manufacturer (i.e., based on quantity, job specification, etc.). Hence, the user, at any time, can add to the available device file 70. This added information overrides the individual records such as record 210 of the device information memory 60. Files 50, 60, 70 and 80 are defined storage areas in conventional memories found in the processor.

3. General Operation (FIG. 3)

Figure 3:
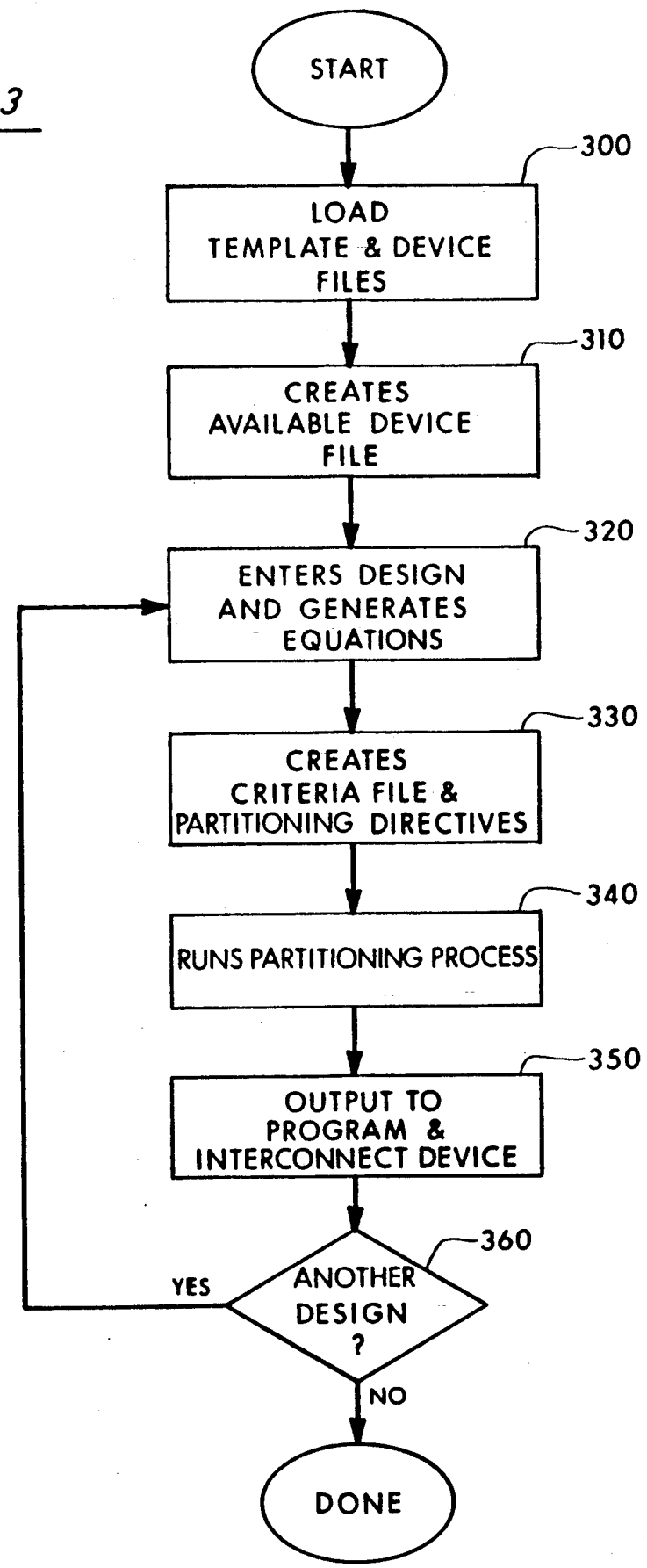
FIG. 3 sets forth the general processing flow and operation of the present invention.

In FIG. 3, the user of the present invention starts operating the system of FIG. 1 (i.e., initializing) by loading in the template and device files 50 and 60 at step 300 through the database input 20. The user then creates at step 310 the available device file 70 through the user input 30 and when completed, the system is initialized and ready for operation. The user can change information in file 70 at any time. It is entirely possible that the user will not create file 70, in which case, the system will partition the equations based upon only the information in files 50 and 60 (i.e., only the price of the device is weighted).

In stage 320 of FIG. 3, the design is entered and the set of equations 40 are generated. This could occur as set forth in the above related patent application or by another suitable process. At this point, the processing enters stage 330 which is the creation of the criteria file and the establishment of the partitioning directives.

A given logical design is often constrained by the user. For example, the price of the design may have a limit, or the maximum amount of power that the design can consume, or the amount of space that the design will use in the implementation, or the maximum amount of time that it will take for a signal to propagate through the design. The partitioning process of the present invention allows the user to set constraints on the physical characteristics of the devices and the process will not use devices that do not fit these constraints. For example, the user may specify that the size of the design must be less than or equal to 3,000 mm² and the propagation delay is less than or equal to 50 nanoseconds. Three possible implementations of this example are: (1) one device occupying 3,000 mm², (2) two devices, with each occupying 1,500 mm², or (3) five devices with each occupying 600 mm² wherein all of the devices exhibit a propagation delay of no more than 50 nanoseconds.

There may also be priorities among the physical limits on the devices. For example, a user may be willing to trade physical size for reduced price or power dissipation for faster propagation delay. The partitioning process of the present invention assigns a cost value to each allowed device (i.e., a device not deleted by the constraints). The user can define certain weighting factors which the system evaluates and then determines a cost value. For example, if the user may wish to weigh price and current (i.e., related to power) as follows:

Price Weight = 10

Icc Weight = 5

The system will assign a weight of 10 to the normalized price and a weight of 5 to the normalized current and then determine a normalized value for cost:

$$\text{Cost} = \sum_{i=1}^{n} W_i * d_i \quad \text{FORMULA 1}$$

where $W_i$ = weight of constraint $i$ as set by user,
$d_i$ = normalized device constraint,
$n$ = the number of different constraints, and
$i$ = a given constraint Therefore, in the example:

Cost = 10* (price) + 5 * (current)

This cost value is used to prioritize solutions so that a "best fit" solution (according to the priorities) will be displayed. In the preferred embodiment, the ten "best fit" solutions are displayed. Under the teachings of the present invention a substantial number of constraints can be weighed. Even though the units of various constraints are anomalous, the process of normalizing all of the constraints to one allows the weighted normalized values to be additive. Normalization is based upon dividing each separate device constraint value, $C_i$, by the maximum constraint value as shown in the following formula:

$$d_i = K * C_i / \max_{i=1}^{M} (C_i) \quad \text{FORMULA 2}$$

where
$K$ = a suitable constant,
$M$ = the number of device entries

The user selected constraints and the weighting factors are stored in the criteria file 80 and are used by the system in device solution for the implementation of the formulas. The constraints define selection limits for the device information and the weighting factors define a cost value.

The user may also specify partitioning directives in file 90. An example of a directive to be added by the operator in the file 90 at step 330 is the assigning of signals to particular pins. In other words, in the user's design of a system, a particular output signal may be assigned to a particular pin in order to retrofit the logic device into an existing system. The partitioning directives, therefore, define predetermined physical relationships for partitioning the formulas. Of course, if no file 90 is established at stage 330, the system of the present invention assumes that there are no physical directives and, therefore, will proceed with providing device solutions to the set of equations.

In stage 340, the system runs the partitioning process of the present invention and generates an output in stage 350 to program the device, if required, and to interconnect the device. This would include the actual information necessary to configure or connect devices to generate the necessary logical operations. This information could comprise fuse maps for programmable devices, net lists for gate arrays and standard cells, and wire lists for standard logic.

The output is displayed or printed in output means stage 100 in FIG. 1. If there is another design, the system at stage 360 returns to stage 320, enters the design and generates a new set of devices. The process then repeats through stages 330, 340, 350 and 360 until done.

In summary of FIG. 3, it can be seen that the operator of the present invention takes a given set of Boolean logic design equations describing a particular design and implements that design in one or more selected physical logic devices. The selected devices can be chosen from hundreds or thousands of commercially available devices. All of the commercially available information concerning each of these devices are loaded into the template file 50 and the device information file 60. The operator can selectively update these files with operator information such as special pricing 70. The operator can then establish a set of constraints and weighted values in the criteria file (such as only using a particular manufacturer's product, or having a particular propagation delay, etc.) and can also set forth partitioning directives in file 90 (such as particular signal to pin assignments).

The process of assigning output signals to devices is mainly concerned with the architecture of the device and only consults the template file 50. The process of constraining devices and prioritizing them is not reliant on the architectural information but only on the physical information associated with the devices and this part of the process only uses the device information file 60.

It is to be expressly understood that the processing order of the steps in FIG. 3 may vary without departing from the teachings of the present invention. For example, creating the available device file 310 could be processed with step 330.

The following is a discussion of the partitioning process 340 of the present invention.

4. Partitioning Process 340

Figure 4:
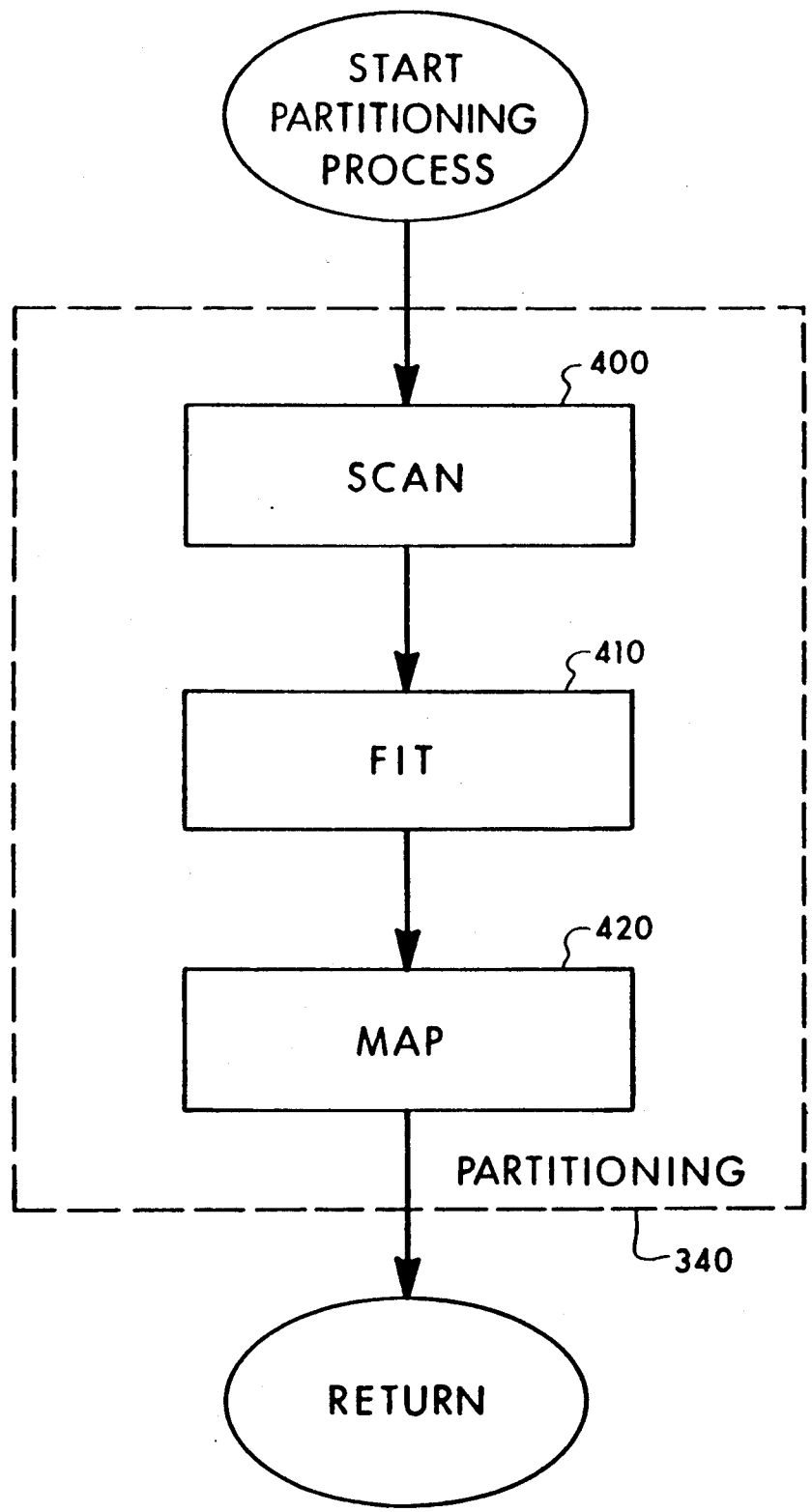
FIG. 4 sets forth the three steps of SCAN, FIT, and MAP for the partitioning process 340 of FIG. 3.

In FIG. 4, the three main partitioning processes of the present invention are set forth.

The first partitioning process 400 scans the set of Boolean logic equations 40. The SCAN process 400 scans the equations associated with the output signals and builds for each output signal a structure that describes the output signal in product terms (hereafter "pterms") that describe the signal.

SCAN 400 under control of the processor then scans the template file 50 seeking templates (i.e., device architectures) wherein at least one output signal will fit into the template. The resulting list of acceptable templates are possible architectures that may be used in a solution. This scan is based only on architectural considerations.

SCAN 400 under the control of the processor then scans the device information memory 60 and for each template in the aforesaid list of acceptable templates finds all of the physical devices that meet or exceed the set forth constraints in file 80. The resulting list of physical devices are then sorted by cost values by the processor and attached to a library entry for each acceptable template for the rest of the partitioning process. The resulting list of acceptable templates with corresponding devices meeting the constraint represent POSSIBLE DEVICES sorted into a list of increasing cost values. This list is then passed to the next stage of FIT 410.

It is to be expressly understood that the order of processing is independent and that the user constraints can be used to filter all of the devices in file 60 and then only the templates corresponding to the selected devices in file 50 can be scanned to fit the equations.

The FIT stage 410 receives the list of possible devices from the SCAN stage 400 and tries various combinations of possible devices to generate a list of fitted device solutions. In the preferred embodiment, the fitted list contains the ten best solutions in order of priority of cost. When it is no longer possible to generate less costly solutions, the fitting process terminates and sends the SOLUTIONS LIST to the MAP stage 420.

The MAP stage 420 takes the SOLUTIONS LIST for each set of physical devices and generates a map (i.e., fuse map, net list, or wire list depending upon the device). The map provides the information necessary for the user to provide the physical implementation of the equations onto the sets of devices in the device solution list.

The operation of the partitioning process 340 set forth in FIG. 4 will now be explained in detail and will be explained with reference to the following example.

A. EXAMPLE

The set of equations 40 used in this example are:

TABLE I

| Functions | Example Set of Equations |
|---|---|
| F1 | $q1 = a*b*/c + a*/d + /a*x1 + /a*b$ |
| F2 | $q2 = a*b*d*x1*x2 + /a*q1 + /b*q2$ |
| F3 | $x1 = a*b*d*e*f$ |
| F4 | $x2 = a*d + a*f + a*q1 + /d*/f*/q1$ | where a, b, c, d, e, f are input signals, and
where q1, q2, x1, x2 are output signals
where + = Boolean OR, * = Boolean AND, / = complement There are two combinatorial output equations (x1 and x2) and two registered output equations (q1 and q2) in the Table I set of equations 40. The important information needed by the equations is the type of the equation (registered, combinatorial), the number of OR-terms in the equation and the list of input signals to this equation (these may not all be input symbols, an equation can use other outputs or even itself as an input). In Table I, functions F1 and F2 are registered functions and F3 and F4 are combinatorial functions.

A product term (pterm) is a Boolean expression containing only signal names or complemented signal names separated by the Boolean AND operator. The equations used by the partitioning process are represented internally by lists of pterms, where each pterm is separated from following pterms by a Boolean OR operator. Pterms are central in the partitioning system of the present invention, as the equations describing the outputs of the system are represented this way. In the above Example, the formula for q1 has the following pterms: $a^*b^*/c$, $a^*/d$, $/a^*x1$, and $/a^*b$. Each pterm when fit under the teachings of the present invention represents the actual connection on the ultimate device. While the sum-of-product terms (pterms) are used in the preferred embodiment, it is to be expressly understood that other equivalent representations such as the product-of-sums could be utilized under the teachings of the present invention.

This example further uses a template file 50 that contains four device architectures that have a mix of combinatorial and registered outputs. There are two PLD-type devices in the library, the P16R4 and the P16R8. The library also contains one PLA-type device, the PLS173 and one PROM-type device, the PLE11R8. Table II sets forth the library list containing the devices for the Example.

TABLE II

| Library List | |
|---|---|
| Index | Device |
| 1 | PLE11R8 |
| 2 | P16R4 |
| 3 | P16R8 |
| 4 | PLS173 |

The example set of equations and the example set of physical devices set forth above will be extensively utilized in the following discussion to explain the operation of the present invention. The invention is not limited to these equations nor to these devices—these are merely illustrations.

B SCAN PROCESS 400

Figure 5:
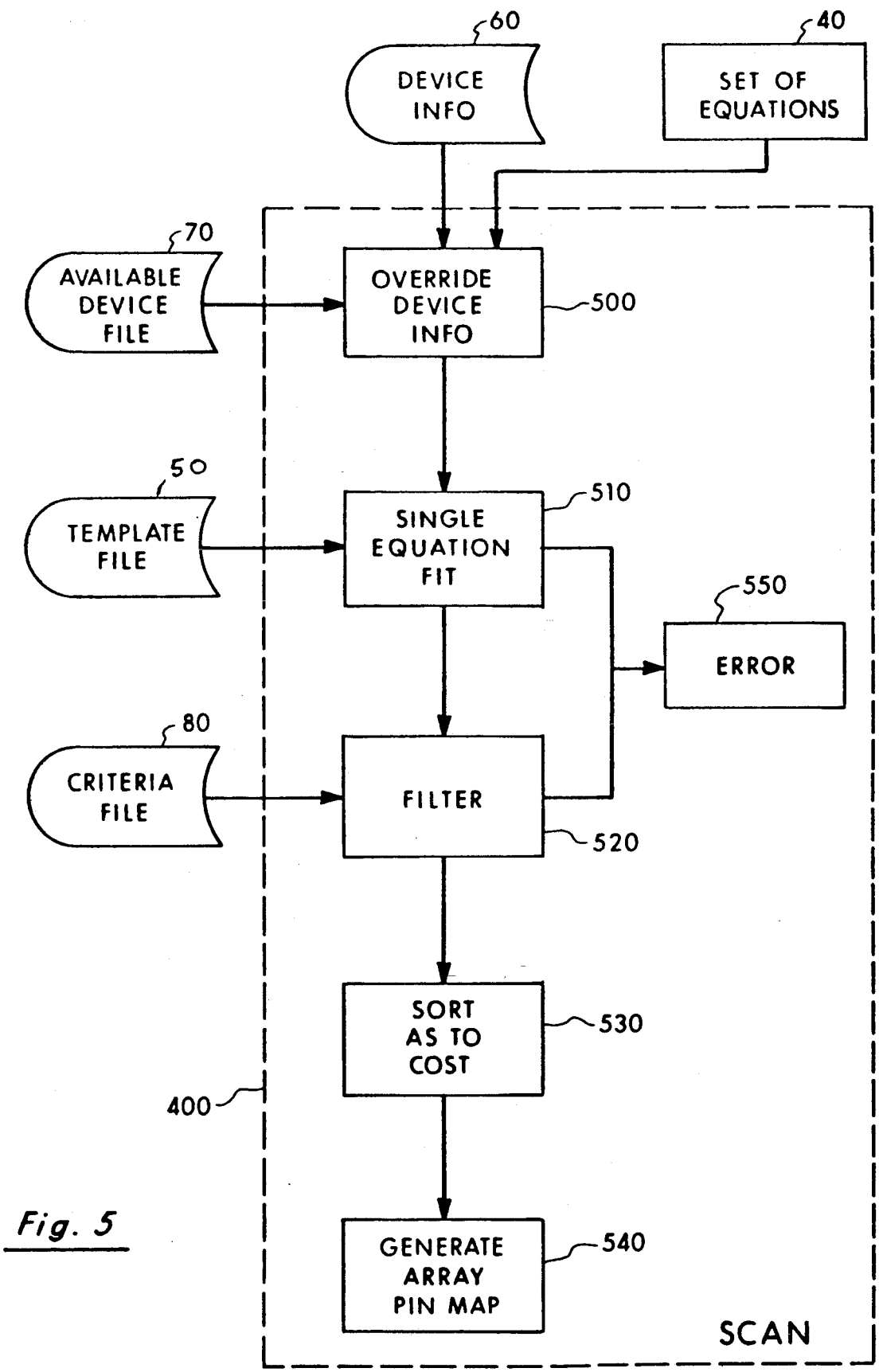
FIG. 5 sets forth the details of the SCAN process of FIG. 4.

In FIG. 5, the details of the scanning process 400 are shown. In the first stage 500, the scanning process 400 receives as inputs the set of equations 40 and the device information file 60. The device information file 60 contains the physical characteristics for each device. In stage 500 the device information file 60 is overwritten with the information from the available device file 70. In other words, the user generated information for each physical device is used to override the device information file.

The partitioning system of the present invention now has an updated set of physical information for each template. The process then enters the single equation fit stage 510 which scans the template file 50 and determines which of the architectures can hold at least one of the functions (in the Example, functions F1, F2, F3, F4) in the set of equations 40. The output of stage 510, therefore, is a list of acceptable templates from the template file 50 that is capable of holding at least one of the equations from the set of equations 40. In stage 510, the architecture of a device is examined to ascertain whether at least one equation can be placed on at least one output of the device. Hence, placing the output on the device, an inquiry is made as to whether enough physical inputs are available. If not, the device fails. Also, the device is analyzed for its ability to handle other parameters or attributes such as polarity, etc. as more fully discussed in section F and FIG. 8 for macrocell 800.

The scanning process 400 then enters the filtering stage 520 which reads in the user defined constraints from the criteria file 80. For each acceptable template from stage 510, all corresponding physical devices in file 60 are read and checked for the constraints. Only those devices which meet or exceed the constraints are retained in an acceptable device memory table by the processor. For example, if the constraint is a propagation delay of a given value, only those physical devices within the constraint for that value are retained. The weights are also analyzed and a cost value is generated. It is to be expressly understood that the determination by the processor of the cost values and the pin map could be performed during subsequent processing stages of the present invention. However, the performance of these two functions as discussed above significantly improves the overall through put of the process.

As mentioned, stages 510 and 520 are independent of each other and the processing order could be reversed to process stage 520 first and then stage 510.

The resulting list of retained devices are then sorted in stage 530 from least costly to most costly for each device and the list of acceptable templates stored in a memory table is then sorted by the processor from least costly to most costly using the first device list entry cost value as the basis for sorting. The final step 540 is to generate a two dimensional array of devices that are candidates for analysis by the fitting stage 410.

An example of the array generated by stage 540 of the Example is shown as follows:

TABLE III

| LIBRARY LIST | | |
|---|---|---|
| Device Name | Cost | Pins |
| PLE11R8 | 178 | 24 |
| PINS:I I I I I I I I R R R G R R R R R C E X I I I V | | |
| P16R4 | 240 | 20 |
| PINS:C I I I I I I I I G E O O R R R R O O V | | |
| P16R8 | 240 | 20 |
| PINS:C I I I I I I I I G E R R R R R R R R V | | |
| PLS173 | 522 | 24 |
| PINS:I I I I I I I I I I I G I O O O O O O O O O V | | |

In the above array there are four devices. Each entry has a device name, a cost value associated with the device generated by the scan process, the number of pins on the device and the type of each pin on the device. The types of pins are defined as:

I input
R registered output
O combinatorial output
C clock input pin
E enable input pin
G signal ground pin
V positive supply voltage pin
X no connect pin As can be witnessed in Table III, the PLE11R8 device has the least cost of 178 and device PLS173 has the greatest cost of 522. Each of the above devices solve at least one of the equations in the set of equations 40 (Table I) and, therefore, are candidates for fitting. Table III sets forth a list of POSSIBLE SOLUTIONS which is stored in a table in memory by the processor.

In FIG. 5, an error stage 550 is entered when at least one of the equations in the set of equations 40 does not fit into any of the architectures in the template file 50. An error 550 can also occur if the user defined constraints are such that all of the devices in stage 520 do not qualify.

The final step in the scan process 400 at stage 540 also generates a pin map. The pin map for the Example is set forth in Table IV below:

TABLE IV

PIN MAP

| Output equation | | | | | | | | | | |
|---|---|---|---|---|---|---|---|---|---|---|
| q1 | | | | | | | | | | |
| PLE11R8 | 9 | 10 | 11 | 13 | 14 | 15 | 16 | 17 | | |
| P16R4 | 14 | 15 | 16 | 17 | | | | | | |
| P16R8 | 12 | 13 | 14 | 15 | 16 | 17 | 18 | 19 | | |
| PLS173 | | | | | | | | | | |
| q2 | | | | | | | | | | |
| PLE11R8 | 9 | 10 | 11 | 13 | 14 | 15 | 16 | 17 | | |
| P16R4 | 14 | 15 | 16 | 17 | | | | | | |
| P16R8 | 12 | 13 | 14 | 15 | 16 | 17 | 18 | 19 | | |
| PKS173 | | | | | | | | | | |
| x1 | | | | | | | | | | |
| PLE11R8 | | | | | | | | | | |
| P16R4 | 12 | 13 | 18 | 19 | | | | | | |
| P16R8 | | | | | | | | | | |
| PLS173 | 14 | 15 | 16 | 17 | 18 | 19 | 20 | 21 | 22 | 23 |
| x2 | | | | | | | | | | |
| PLE11R8 | | | | | | | | | | |
| P16R4 | 12 | 13 | 18 | 19 | | | | | | |
| P16R8 | | | | | | | | | | |
| PLS173 | 14 | 15 | 16 | 17 | 18 | 19 | 20 | 21 | 22 | 23 |

In Table IV above, the output equation q1 can be placed on the first three devices listed in the pin map but cannot be placed on device PLS173 (i.e., equation q1 requires a registered output, device PLS173 has no registered output). For example, in Table III, the first 8 pins for the PLE11R8 are input I pins and, therefore, the first available output pin is pin 9. Pin 12 for the PLE11R8 is ground and pin 12 cannot be used as a signal output. The pin map provides the system of the present invention with the physical pin layout of those pins available for fitting the output of an equation.

C. FIT PROCESS 410

Figure 6:
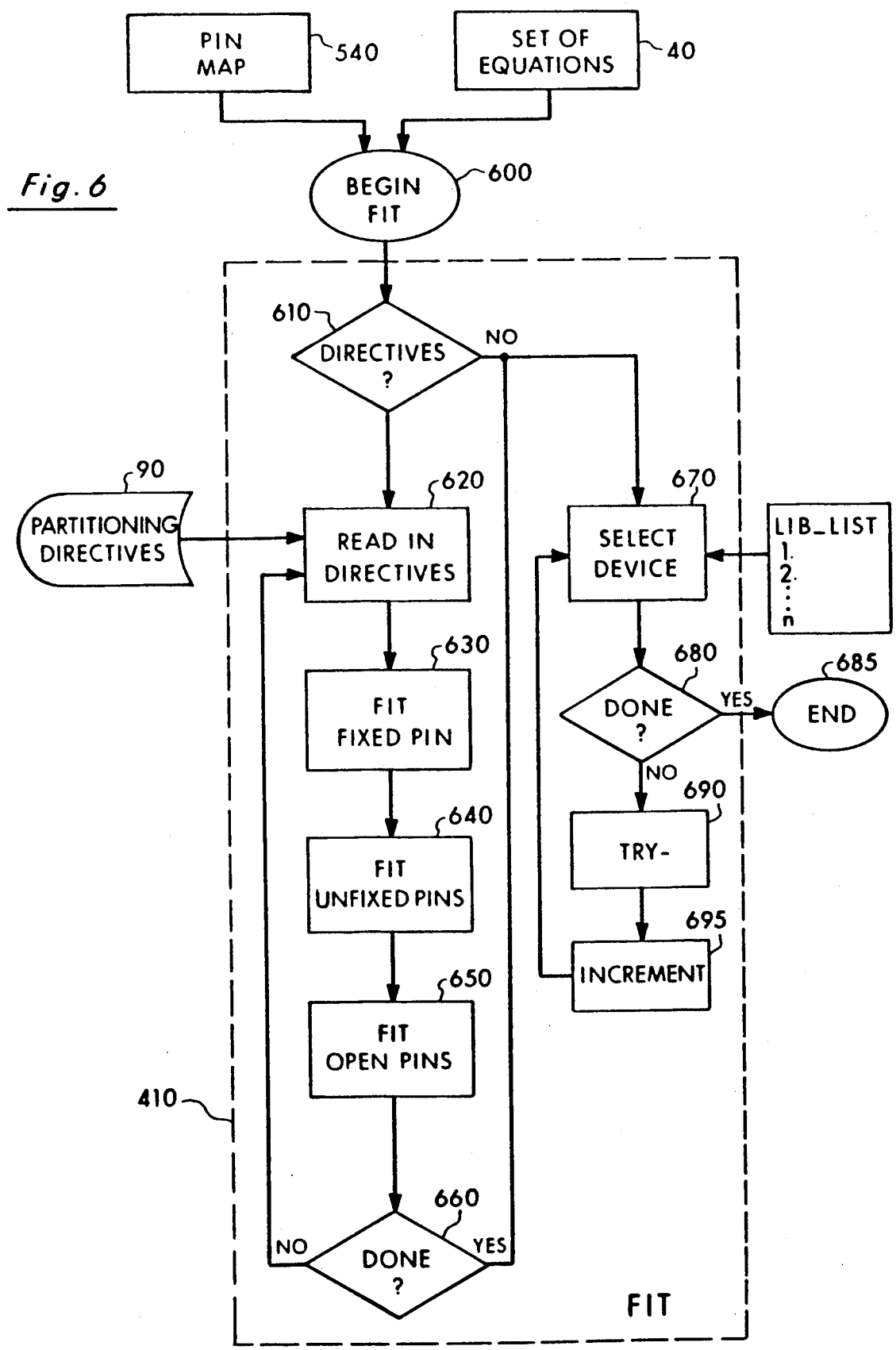
FIG. 6 sets forth the details of the FIT process of FIG. 4.
Figure 7:
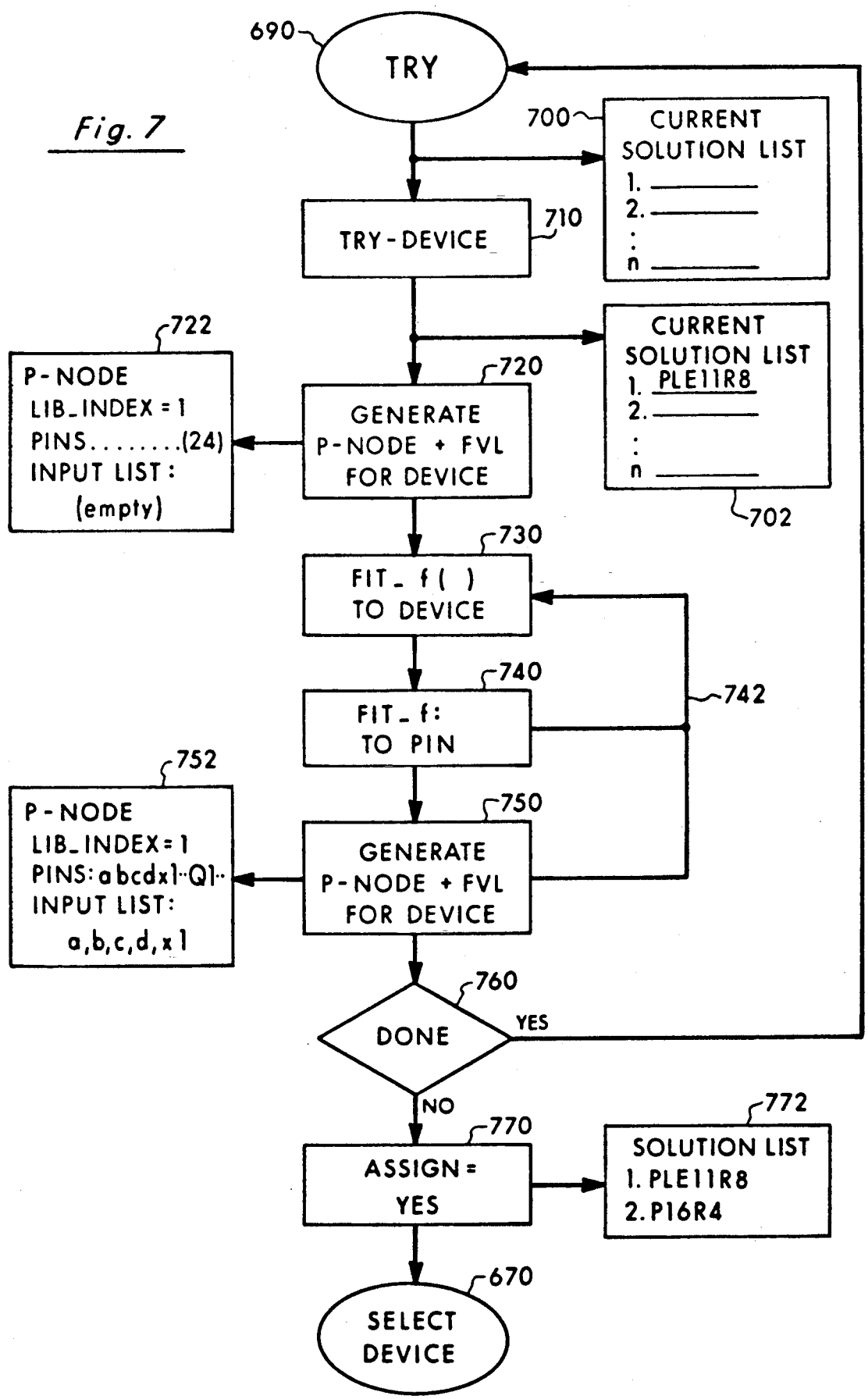
FIG. 7 sets forth the details of the TRY process.

In FIGS. 6 and 7, the details of the FIT process 410 are set forth.

The FIT process 410 utilizes information from the pin map 540 and from the set of equations 40. When the FIT routine is entered 600, a question is asked at stage 610 as to whether or not any partitioning directives are present. If the user has defined partitioning directives, stage 620 is entered and the partitioning directives are read in from the partitioning directives file 90.

In the following second example (which is different from the Example of Table I), assume the user has defined the following pin assignments to a twenty pin device for an equation having values of CLK, A, B, X, Y, and Z:

CLK 1, A:2, B:3, X:15, Y:16 where "CLK" means the clock signal and "1" means pin 1

The user did not assign variable Z to any pin. Hence, the user does not care where output Z is assigned.

Likewise, there are additional open pins 3-14 and 17-20 on the twenty pin device.

After reading in the directives, stage 630 is entered and the process fits the fixed pins as dictated by the partitioning directives 90. In the aforesaid example, during stage 630, the clock is assigned to pin 1, variable A to pin 2, variable B to pin 3, variable X to pin 15, and variable Y to pin 16.

Stage 640 is then entered and the process will assign Z to one of the remaining pins. Hence, for the aforesaid example, pin Z could be assigned to pin 17 by the system of the present invention. At this point in time, stage 650 is entered and the system will attempt to use the remaining open pins (in the aforesaid example, pins 4-14 and 18-20) to assign the other equations. If additional equations can be fit, the device becomes more cost effective (i.e., a lower overall price).

Stage 660 then determines whether or not the system is done with the partitioning directives. If not, it reads in the new set of directives for the next device at 620 and the process repeats. If done, the system enters the select device stage 670 which will be explained in the next section. Likewise, if there were no directives at the outset in stage 610, the select device stage 670 is entered.

The output signals from the set of equations fall into four partitioning classes or types. These classes are:
1. Output signals which are fixed to pins on a device.
2. Output signals fixed to a device but not fixed to specific pins.
3. Output signals grouped together but not fixed to a particular device (e.g., ordering of signals in a bus).
4. Output signals that can be placed anywhere (i.e., not fixed to a device or to a pin).

Hence, the user in the partitioning directives file can specify the class for the output signals in the set of equations 40.

D. SELECT DEVICE PROCESS 670

In the Example of Table I, no partitioning directives 90 were set in place by the user. Hence, in FIG. 6, begin FIT 600 enters the select device stage 670. The process selects the first device in the library list (Lib_List) which in the above example from Table II is device PLE11R8. An inquiry at stage 680 is then made as to whether or not all devices have been selected. If so, the process ends at 685 and writes the solutions to a file for use by the MAP process 420. If not stage 690 is entered which is the Try_Device stage. This stage will be discussed in greater detail in the next section. When completed with the Try_Device stage 690, the system increments the index in the library list at stage 695 and the next device is selected in the library list at stage 670 and the process repeats for each of the devices. It is important to note, that for purposes of discussing the operation of this section, the devices in the Library List are linearly accessed. However, greater performance is achieved by accessing the devices in the Library List in a non-linear fashion such as, for example, selecting the middle device, the last device, the first device in an iterative fashion throughout the list.

TRY DEVICE PROCESS 690

The Appendix, attached as part of the specification, sets forth the process of fitting each of the devices in the library list to the set of equations 40 for the example of Table I. As the process is repetitive for each device, the following discussion with cross references to the Appendix illustrates how the present invention tries to fit the first device in the library list, the PLE11R8.

The Try routine 690 is entered with:

try (1, [])                                                Appendix #1

This enters Try 690 and the "1" indicates which device is being indexed. As shown in Table II for the Example, this device is PLE11R8. It also indicates that the current solution list, [] is empty.

In FIG. 7, when the TRY routine 690 is entered, the current solution list 700 is initially empty. As each device is tried through the library list, the current solution list 700 will have all devices tried as entries as will be discussed in the following. At the beginning of the analysis, however, the current solution list is empty.

Stage 710 is then entered and the first device from the library list, PLE11R8, is tried as follows:

try_device (1, PLE11R8, [1])   Appendix #2

The above statement places the first entry in the solutions list for the device PLE11R8. The [1] indicates that this is the current solution in list 700. This is shown by current solution list 702 in FIG. 7.

In stage 720 a Pnode table for the device is generated and is initially empty as shown by element 722. The Pnode 722 contains the library index (Lib_Index) which is equal to 1 (refers to first device in the lib-list), the number of pins which are in this example 24, and an input list which is currently empty.

In addition, a functional variable list (FVL) is also generated for the device. In the example set of equations in Table I, q1 and q2 are "available outputs" and x1 and x2 are "always inputs" since they are required as inputs in the solution of equations q1 and q2. The purpose of FVL is to ascertain which equation has the most inputs in common with the output equations already placed in this device, and the following overlap test is used by the present invention:

$t$ = input list associated w/Pnode $p$ = input list associated w/equation

For each signal name in t, if the corresponding signal name is in p, then a +1 is added to the overlap sum. If the corresponding signal is not present in p, then a −1 is added to the overlap sum. At this processing point, no variables are in the Pnode table, and therefore each variable in the equation is counted as −1. Hence, for equation q1, the count is −5 (i.e., variables: a, b, c, d, x1).

For the Example, this results in the following table:

TABLE V

| FUNCTIONAL VARIABLE LIST (FVL)* | | | |
|---|---|---|---|
| Output | Class | Overlap | Auxiliary |
| q1 | AVAIL OUTPUT | −5 | 0 |
| q2 | AVAIL OUTPUT | −7 | 0 |
| x2 | ALWAYS INPUT | −4 | 0 |
| x1 | ALWAYS INPUT | −5 | 0 |

*See Appendix #3

The system orders the entries in the table with the largest overlap to the smallest overlap in each classification. Hence, q1 is placed first over q2 because it has a larger overlap. For purposes of this part of the example, none of the auxiliary functions are utilized and hence the FVL table shows zeroes. The use of the auxiliary function will be discussed subsequently.

The system then takes the first function (q1 in the Example) from the FVL. This function is believed to be the most likely to fit because it has the greatest overlap. This occurs in stage 730 and is represented by the following function:

fit_f (PLE11R8[1])   Appendix #4

The term "PLE11R8" identifies the Pnode 722, the term [1] is the first device in the library index, and the term fit_f( ) selects the first function from the FVL list (Table V above) and then scans the pin map (Table IV) to select the first pin in the pin map. In Table IV, the first pin for device PLE11R8 is pin 9. Therefore, the process continues:

fit_f: q1 placed on pin 9 of PLE11R8   Appendix #5

This is shown in FIG. 7 as stage 740. Here q1 is placed on pin 9 of the device and this stage verifies that the architecture will match with q1 assigned to pin 9. An additional consideration in placing an equation such as q1 on a pin is to select the least capable pin. A least capable pin, for example, is one that has the fewest OR-terms that will accommodate the equation. This feature is important because it more efficiently places the equation on the device thereby leaving available more capable pins for additional equations.

The functional assignment (fa) occurs at this point showing that equation q1 is assigned to device 1 (i.e., q1:1):

fa: q1:1 q2:−1 x1:−1 x2:−1   Appendix #6

Since it matches the architecture, the following occurs:

assign_inputs: partial   Appendix #7

Hence, the inputs are assigned and output q1 is assigned to pin 9. The Pnode list is then modified as shown as element 752 of FIG. 7. Pnode 752 continues to show that the library indexes device 1 but that it now assigns inputs a, b, c, d, and x1 to pins 1−5 Pins 6, 7, and 8 are still unassigned and output q1 has been assigned to pin 9. The "input list" now lists inputs a, b, c, d, and x1.

In the event the function did not fit the pin in stage 740, the next function is selected over line 742 and stage 730 is entered with the next function in the FVL list. In this event, the attempted function is marked as an ALWAYS INPUT in the FVL table. However, in our Example, the first function q1 did fit and therefore a new Pnode table 752 is generated. In addition, in stage 750, a new FVL list is generated as set forth in the following table.

TABLE VI

| | FVL | | |
|---|---|---|---|
| Output | Class | Overlap | Auxiliary |
| q2 | AVAIL OUTPUT | +1 | 0 |
| x1 | ALWAYS INPUT | +1 | 1 |
| x2 | ALWAYS INPUT | 0 | 0 |
| q1 | ALREADY ASSIGNED | +5 | 0 |

*Appendix #8

Again, the entries are sorted by classification with the entry having the greatest overlap appearing first in the table. Hence, with respect to the ALWAYS INPUT classification, x1 is placed over x2 because it has a greater overlap value. Furthermore, the auxiliary column for x1 is marked "1". The auxiliary column indicates whether or not the output is also an input for the processed equation. Here x1 is an input for equation q2 and the auxiliary column is so marked. At this point in time, q1 is assigned (Appendix #9) and the system returns over 742 to stage 730 and tries to fit the next function in the FVL list which is q2 to the device.

In stage 740, q2 tries to fit to pin 10 since pin 9 has already been assigned to q1 (Appendix #10). In the example, q2 successfully fits the pin 10 and, therefore, the Pnode 752 is updated to read as follows:

TABLE VII

| Pnode* |
|---|
| Lib_Index:1 |
| PINS: a b c d x1 x2 ... q1 q2 ... |
| INPUT LIST: |
| a, b, c, d, x1, x2, q1, q2 |

*Appendix #11

Inputs x2, q1 and q2 are added as inputs to the Input List because they are inputs in function f2 as shown in Table I.

A new FVL is computed:

TABLE VIII

| | FVL* | | |
|---|---|---|---|
| Output | Class | Overlap | Auxiliary |
| x2 | ALWAYS INPUT | +2 | 1 |
| x1 | ALWAYS INPUT | +1 | 1 |
| q2 | ASSIGNED OUTPUT | +7 | 1 |
| q1 | ASSIGNED OUTPUT | +5 | 1 |

*Appendix #12

At this point in processing for the example of Table I, no available outputs are left. Stage 760 is entered and the system of the present invention ascertains whether or not any equations are left which have not been assigned. If all of the equations have been assigned, the process is done (Appendix #13) and stage 770 is entered. Here, final assignment is performed. This consists of assigning all of the input signals and those output signals that must be assigned as inputs to this device (i.e., x1 and x2). In the case of an output signal assigned to a device output wherein the device output does not have a feedback path and the output signal is used as an input by other equations on this device, then this output signal is also assigned to an input pin. On the other hand, if equations are left and have not been assigned, then the Try_Device stage 710 is reentered with another device to see if the remaining equations can be fitted to the device.

In the example of Table I, the second device in the library list is now tried which is device P16R4 of Table II. The instruction calling this device is:

try (2, [1])                                    Appendix #14

The current solutions list 700 now shows device PLE11R8 entered into item number 1. At this point, the process again considers device 1 in the library list, but device 1 cannot place any of the available outputs. Hence, the process continues to the next device. The process enters stage 710:

try_device (2, P16R4, [1, 2])                   Appendix #15

This indicates that device number 2 is entered into the current solution list 702 and the [1,2] indicates that device number 1 is already listed and that device number 2 is being placed in the current solution list 702. Stage 720 is then entered and, as before, an empty Pnode list 722 is generated. A functional variable list (FVL) is then created:

TABLE IX

| | FVL* | | |
|---|---|---|---|
| Output | Class | Overlap | Auxiliary |
| x2 | AVAIL OUTPUT | −4 | 0 |
| x1 | AVAIL OUTPUT | −5 | 0 |
| q1 | ALREADY ASSIGNED | −5 | 0 |

TABLE IX-continued

| | FVL* | | |
|---|---|---|---|
| Output | Class | Overlap | Auxiliary |
| q2 | ALREADY ASSIGNED | −7 | 0 |

*Appendix #16

In this case, q1 and q2 are already assigned, as discussed above, and the next available output to be fitted is x2.

The process enters stage 740 and from the pin map of Table IV, the first available pin for P16R4 is pin 12 (Appendix #17). Hence, in stage 750 a new Pnode 752 is generated as follows:

TABLE X

| Pnode* |
|---|
| Lib_Index: 2 |
| Pins: . a d f ... x2 ... |
| Input List: |
| a, d, f, q1 |

*Appendix #18

A new FVL table is generated:

TABLE XI

| | FVL* | | |
|---|---|---|---|
| Output | Class | Overlap | Auxiliary |
| x1 | AVAIL OUTPUT | +1 | 0 |
| q1 | ALREADY ASSIGNED | −1 | 1 |
| x2 | ALREADY ASSIGNED | +4 | 0 |
| q2 | ALREADY ASSIGNED | −1 | 0 |

*Appendix 19

The overlap is computed as follows for x1. X1 has variables a, b, d, e, f. In Table X, the input list is a, d, f, q1. Hence, the overlap is computed:

| X1 Variables (t) | Pnode Inputs (p) | Count |
|---|---|---|
| a | a | +1 |
| b | | −1 |
| d | d | +1 |
| e | | −1 |
| f | f | +1 |
| Overlap Sum | | +1 |

X1 has an overlap sum of +1. Notice that the auxiliary column for q1 is marked "1". This recognizes that output x1 is also an input to q1. The FVL table is sorted by class, then within the class by auxiliary (i.e., "1"), and then by degree of overlap. The system returns 742 to the FIT function to the device stage 730 since a function x1 remains to be fitted to the device. In reference to Table IV showing the pin map, output x1 can be assigned to pin 13 in stage 740 since pin 12 is already assigned to x2. In stage 750 a new Pnode table is generated:

TABLE XII

| Pnode* |
|---|
| Lib_Index 2 Pins: |
| . a d f q1 b e ... x2 x1 ... |
| Input List: |
| a, b, d, e, f, and q1 |

*Appendix #20

At this point all outputs and functions in the equation set 40 of the Example of Table I have been assigned (Appendix #21) and the physical assignment takes place in stage 770. A Solution List 772 is generated showing the two devices PLE11R8 and P16R4, in the example, being assigned.

At this point, the select device stage 670 of FIG. 6 is entered and the next device in the library list is selected (Appendix #22). The entire process of FIG. 7 then repeats for the next device. In this fashion, all combinations of all devices will be attempted to fit into the equations and a Solution List will be generated. The Solution List is sorted in order from least cost to highest cost and for the example set forth in the Appendix 1, eight solutions are possible for the four commercially available devices for the equation set of Table I. Under the teachings of the present invention, only the ten best solutions are used although it is to be expressly understood that any suitable number could be utilized. The ordered Solution List is set forth in the following table:

TABLE XIII

| Solution | Solution List* Cost | Device List |
|---|---|---|
| 1 | 240 | P16R4 |
| 2 | 418 | PLE11R8 |
|  |  | P16R4 |
| 3 | 480 | P16R8 |
|  |  | P16R4 |
| 4 | 700 | PLE11R8 |
|  |  | PLS173 |
| 5 | 700 | PLS173 |
|  |  | PLE11R8 |
| 6 | 762 | P16R8 |
| 5 |  | PLS173 |
| 7 | 762 | PLS173 |
|  |  | P16R4 |
| 8 | 762 | PLS173 |
|  |  | P16R8 |

*Appendix #23

As shown in the Appendix, the equation assignments are also made. The equation assignment for solution 1 has the lowest cost figure of 240.

The performance of the present invention is significantly improved over the presentation set forth above by continually comparing the cost value of the devices comprising the next possible solution against the cost value of the devices comprising the last entry in the current solution list. This practically weeds out higher cost value solutions thereby speeding up the overall processing time.

While the example of Tables I and II and the Appendix have been used to explain the operation of the above processes of the present invention, the teachings of the present invention are not so limited and many other Boolean logic equations and commercially available devices are correspondingly processed.

F. FIT FUNCTION TO PIN 740

Figure 8:
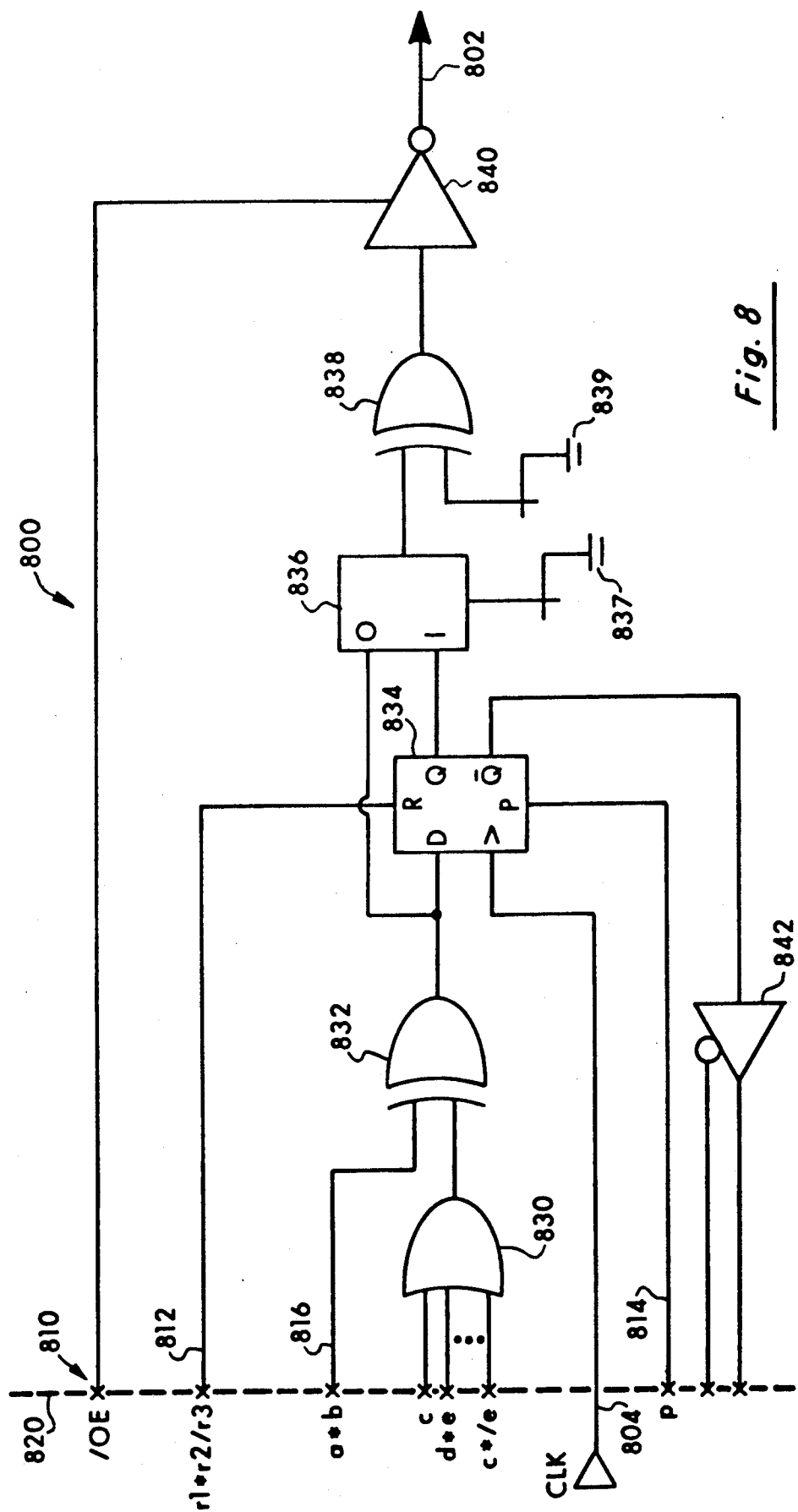
FIG. 8 illustrates a conventional complex macrocell.
Figure 9:
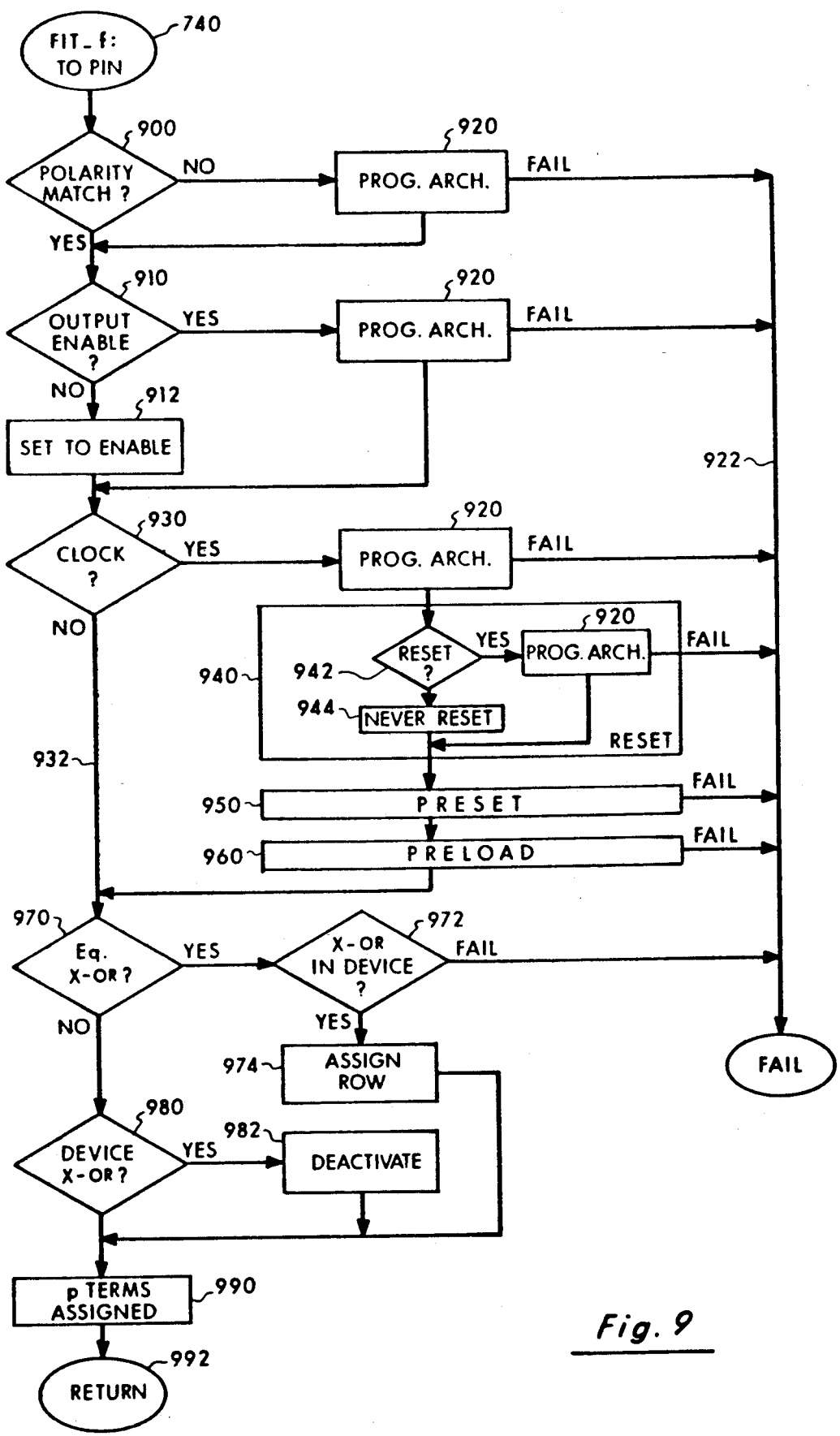
FIG. 9 sets forth the details of the fit function to pin process.
Figure 10:
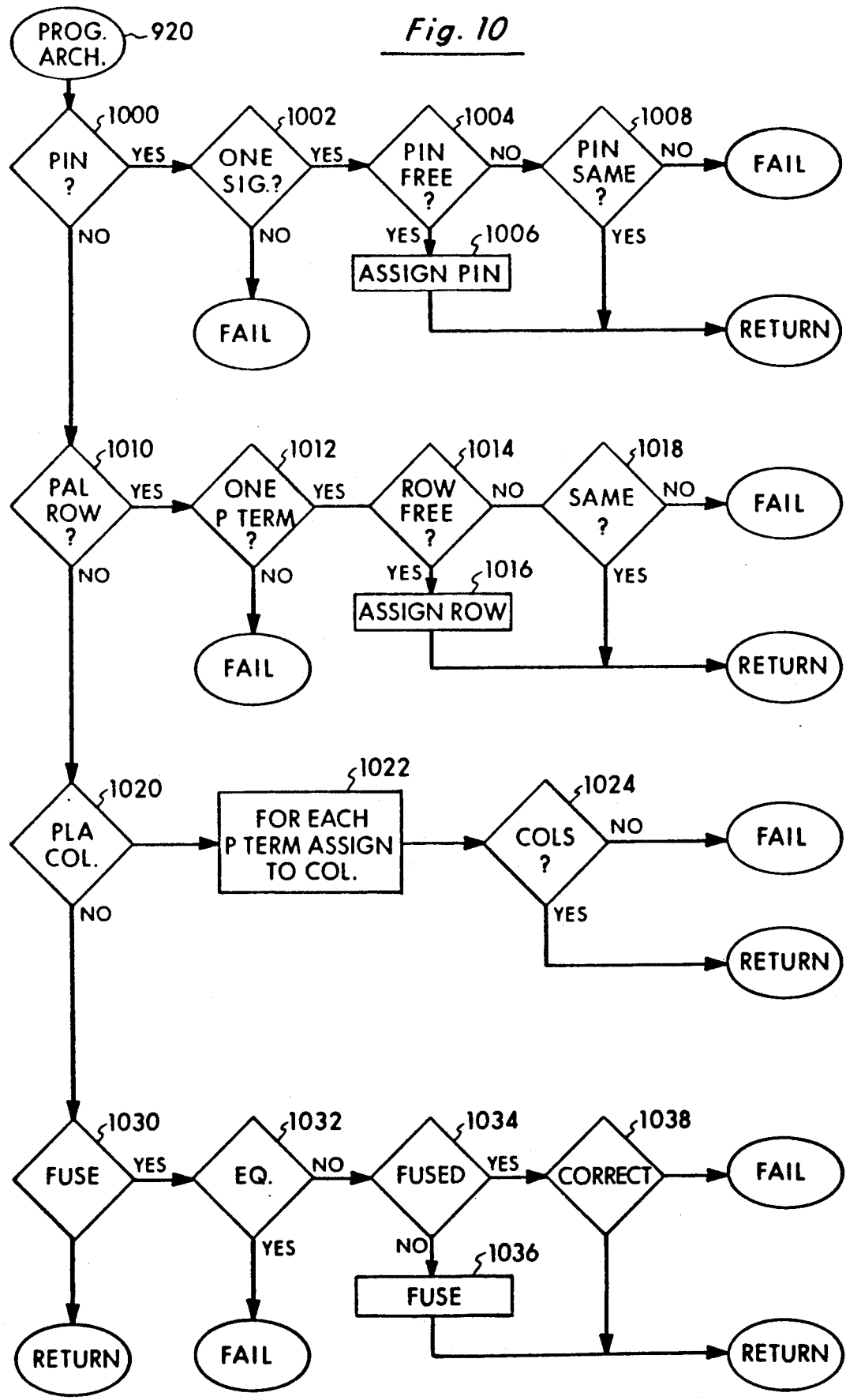
FIG. 10 sets forth the details of the program architecture process.

In FIGS. 8-10 the details of the Fit-Function-to-Pin process 740 is set forth for an output macrocell. A number of conventional software approaches are available for fitting functions to pins of physical logical devices. What follows is the present invention's approach to the fitting process which incorporates a number of these prior concepts. In FIG. 8, a complex macrocell contained in a logical device such as a pAL 22V10 (for example, manufactured by AMD) is illustrated. The macrocell 800 shown in FIG. 8 has an output 802 which is delivered to a pin and an input 804 which is also delivered from a pin. The remaining inputs and outputs 810 are interconnected through a conventional matrix 820 by means of a fusing pattern which is conventionally known. The macrocell 800 has an OR-gate 830, an exclusive-OR gate 832, a D-type flip-flop 834, a fuse control circuit 836, an exclusive-OR fuse control circuit 838, an output enable circuit 840, and a feedback circuit 842.

A number of logical operations can be designed with the macrocell 800 depending upon the fusing arrangement of the matrix 820 and the states of the fuses 837 and 839. For example, the circuit 800 operates as a register circuit or a combinatorial circuit depending on whether or not fuse 837 is used. Likewise, macrocell 800 can operate in the high true or low true mode depending on whether fuse 839 is used. Feedback path as provided by device 842 allows the present invention under the "auxiliary" column of the FVL table to make use of this path in fitting additional equations to a device.

The following example will be utilized to explain the fit function to pin process 740 in relationship to a complex macrocell such as set forth in FIG. 8.

This example assumes that the following equation will be fit to the macrocell 800:

TABLE IX

| Z.D = | (a*b) (+) (c+d*e+c*/e) |
|---|---|
| Z.clock = | clk |
| Z enable = | /oe |
| Z.preset = | p |
| Z.reset = | r1*r2*/r3 |
| Z.polarity = | 1 |
| Z.preload = | (none) | where (+) means exclusive-OR

In the example set forth in Table I and in the ensuing discussion for that example, only the main Boolean logic formulas were presented. This was for simplicity of discussion. However, it is to be expressly understood that accompanying formulas such as those set forth above in Table IX are also produced in the set of equations 40. In the above listing, output Z is of a D-flip-flop type which is present in FIG. 8 by devices 834 and 836. Likewise, Z utilizes a clock (clk), an output enable (/oe), a preset (p), and a reset (r1*r2*/r3). However, Z is high true (when polarity=1, it is high true and when polarity =0, it is low true) and, there is no preload requirement for Z. This set of equations (Table IX) will now be utilized with the macro circuit 800 to illustrate the operation of the fit of the function to the pin 740.

It is to be expressly understood that this example of FIG. 8 and Table IX is for purposes of explaining the operation of the Fit-Function-to-Pin process of the present invention and that the invention is not so limited.

In FIG. 9, the Fit-Function-to-Pin 740 process is set forth. First a polarity match is determined. If there is a polarity match at stage 900, the system continues to stage 910. For example, if the equation is a high true and the device output is high true, a match occurs and stage 910 is entered. If the device output is not high true, stage 920 is entered and in this case the device would fail. An alternative to failure is to change the polarity of the equation through application of de Morgan's theorem as conventionally known. However, if the device is of the type shown in FIG. 8 where fuse 839 can be used to adjust the output polarity of the device, the program architecture 920 will indicate that the fuse 839 is to be used and the process will enter stage 910.

In stage 910, the fit pin routine 740 analyzes the output enable equation which, as set forth in Table IX above, contains only one pterm (i.e., /oe). The program architecture routine 920 is again entered and if the device does not have the ability to be enabled, the device fails. However, if the device such as the macrocell 800 has an output enable 810, the program architecture will assign the output enable oe to row 810. The process then returns to enter stage 930. In the event in stage 910 there is no output enable equation, the process enters state 912 which causes the program architecture to set the enable row 810 to be always enabled. The process then enters stage 930.

In stage 930, an inquiry is made as to whether or not there is a clock equation and if there is, then the program architecture process 920 is again entered. If the device does not have a clock, the device fails. If the device has a clock, the clock is assigned as shown in FIG. 8 to lead 804.

The process then evaluates the reset, preset, and preload equations for Z set forth in Table IX. Since this process is the same for each of these equations, only the details for the reset equation will be discussed. The reset analysis occurs in stage 940 wherein stage 942 asks the question whether or not a reset equation exists. If it does, the program architecture is entered 920 and if the device does not have a reset it fails. The macrocell 800 of FIG. 8 has a reset on lead 812 and the program architecture assigns the equation r1*r2*/r3 to row 812. In other words, the equation for Z.reset contains only one pterm. The process then returns to enter into the preset stage 950. In the event that at stage 940 there is no reset equation, stage 944 is entered. In stage 944, the program architecture 940 is instructed to configure the macrocell 800 so that a reset will never occur.

The preset stage and the preload stages 950 and 960 function in the same fashion. In the example in FIG. 8, the preset equation also contains one pterm (i.e., p) and that is assigned to lead 814. The preload equation for Z does not exist and macrocell 800 does not have a preload available. If there were a preload for Z, macrocell 800 would fail. If there were no preload for Z, but a preload were available in the device, it would always be disabled.

In FIG. 9, the Fit-Function-to-Pin routine 740 continues on line 932 by entering the stage 970 where an inquiry is made as to whether or not the equation has an exclusive-OR. If it does, as set forth in Table IX for equation Z, then stage 972 is entered. This stage inquires as to whether or not the device physically has an exclusive-OR circuit in it. If not, the device fails and if so, as in the case of the macrocell 800, stage 974 is entered. Stage 974 ascertains which part of the equation contains only one pterm. In the example, Z contains a single pterm (i.e., a*b). This then is assigned to row 816. The second part of stage 972 assigns the remaining pterms to the other rows. In the example set forth in Table IX above, c, d*e, and c*/e are assigned to rows of device 830.

If in stage 970 there was not an equation with an exclusive-OR, stage 980 is entered and the device is checked for the existence of a hardware exclusive-OR circuit. If there is an exclusive-OR circuit in the device such as 832 in the macrocell 800 of FIG. 8, stage 982 is entered and the exclusive-OR is deactivated. For example, a zero would be assigned to row 816 in FIG. 8.

Finally, upon leaving stage 980, the process is complete and the pterms are assigned 990 to the rows of the device. Any rows left over after assignment of pterms are deactivated (see items 1200 in FIG. 12). However, if there are not enough rows for the number of pterms in the equation, the device fails. An alternative approach to prevent failure would be to factor the equation into smaller equations. The process then returns to the TRY routine of FIG. 7.

In FIG. 10, the program architecture process 920 is set forth. Stage 1000 is entered to ascertain whether or not the assignment is to a pin. If it is, stage 1002 is entered to ascertain whether a single signal is being applied to the pin. For example, in Table IX, Z.clock=clk represents a single signal and therefore clk can be assigned to a pin. If more than one signal is represented, it must fail. Stage 1004 is then entered to ascertain whether or not the pin on the device is free. With reference to the macrocell 800 of FIG. 8, pin 804 is free and therefore, in stage 1006, the pin can be assigned to the clock. In the event that the pin on the device was already assigned, stage 1008 is entered and if that pin has already been assigned to the clock signal it can still be interconnected for these purposes and therefore everything passes. If not, then of course there is a failure. Hence, the pin determination ascertains whether or not the equation for the pin contains one signal, whether or not the pin is free for assignment, and if already assigned, whether or not it is the same assignment.

In the event the program architecture process 920 is entered and no pin is ascertained in stage 1000, stage 1010 is entered to ascertain whether or not a PAL (programmable array logic) device row is involved. If it is, then stage 1012 is entered to ascertain whether or not one pterm is involved. If more than one pterm is involved it fails but if only one pterm is involved, stage 1014 is entered. In the example of Table IX, line 812 involves the pterm r1*r2*/r3 and hence stages 1010 passes to stage 1012 which in turn passes to stage 1014. If row 812 is free, then r1*r2*/r3 is assigned to row 812 at stage 1016. If the row is not free, stage 1018 is entered and an inquiry is made that if it is assigned to a pterm is it the same pterm. If it is, then the system returns, if not it fails.

Where the device is a PLA (programmable logic array) stage 1020 is entered and for each pterm in the equation an assignment is made to a column in stage 1022. The problem is whether or not enough columns are available and if not enough columns are available in stage 1024 the device fails and if there are enough columns available it passes and the process returns to the fit pin.

The process now enters stage 1030 which is the fuse stage. If there is a requirement to fuse, in stage 1032, an inquiry is made as to whether or not this is an equation. If it is, it must fail, as the state of a fuse cannot depend on external signals. If it is not an equation, stage 1034 is entered and a question is made as to whether or not the fuse has already been used. If it has not, stage 1036 is entered and the indication to use the fuse is made. If the fuse has been used a determination in stage 1038 as to whether or not it is correct is made. For example, in FIG. 8, the determination of the high true or low true in Table IX is that the device must be set for high true. Hence, in stage 1034 and with respect to fuse 839, if the use of fuse 839 causes a high true to the macrocell 800, then stage 1036 is entered. If the fuse has already been used, stage 1038 ascertains whether or not it is in the high true or low true mode and if in the high true mode the program architecture 920 returns.

It is to be expressly understood that other architectural elements in other technologies can be processed as discussed above for pins 1000, PAL rows 1010, PLA columns 1020, and fuses 1030. For example, gate arrays and standard cell devices can be processed by treating their internal elements as small, but versatile macrocells. Standard logic elements, such as 7400 logic series devices, can be treated as specialized macrocells with limited programmability. Likewise, other elements such as folded NAND structures, folded NOR structures, or segmented array architectures can also be processed. In other words, the present invention is not limited to the specific technologies set forth in the discussion of FIG. 10 nor to the order presented in FIG. 10.

G. MAP PROCESS 420

The MAP process 420 is dependent upon the nature of the device technology involved. The present invention provides an output tailored for the specific requirements of programmable logic devices. For the Example of Table I, the following discussion concentrates on generation of a fuse map for the 16R4 device which is the lowest cost value solution in Table XIII. Other output types (net list, wire list, etc.) may be necessary for other device technologies.

Figure 11:
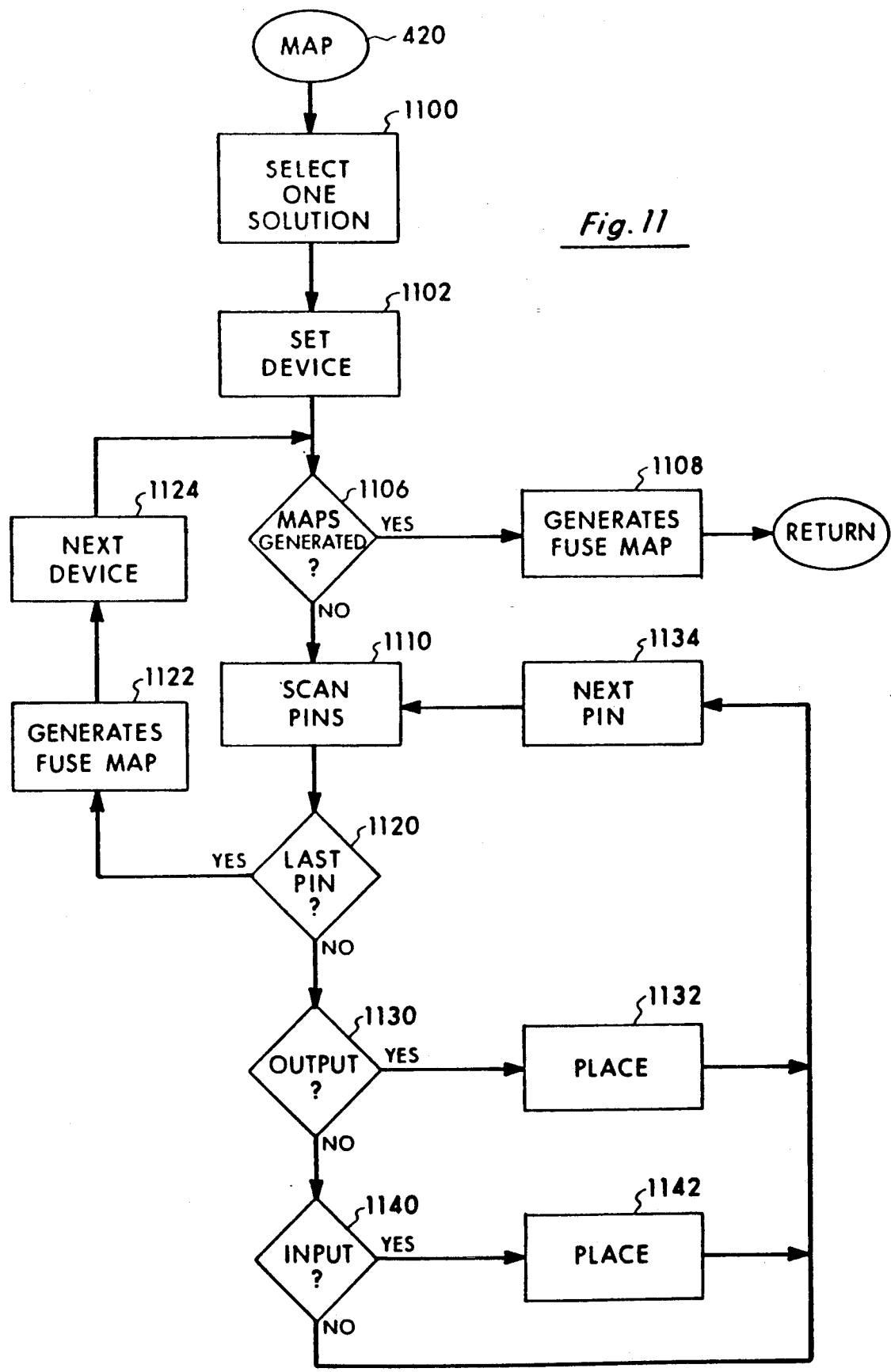
FIG. 11 sets forth the details of the MAP process.
Figure 12:
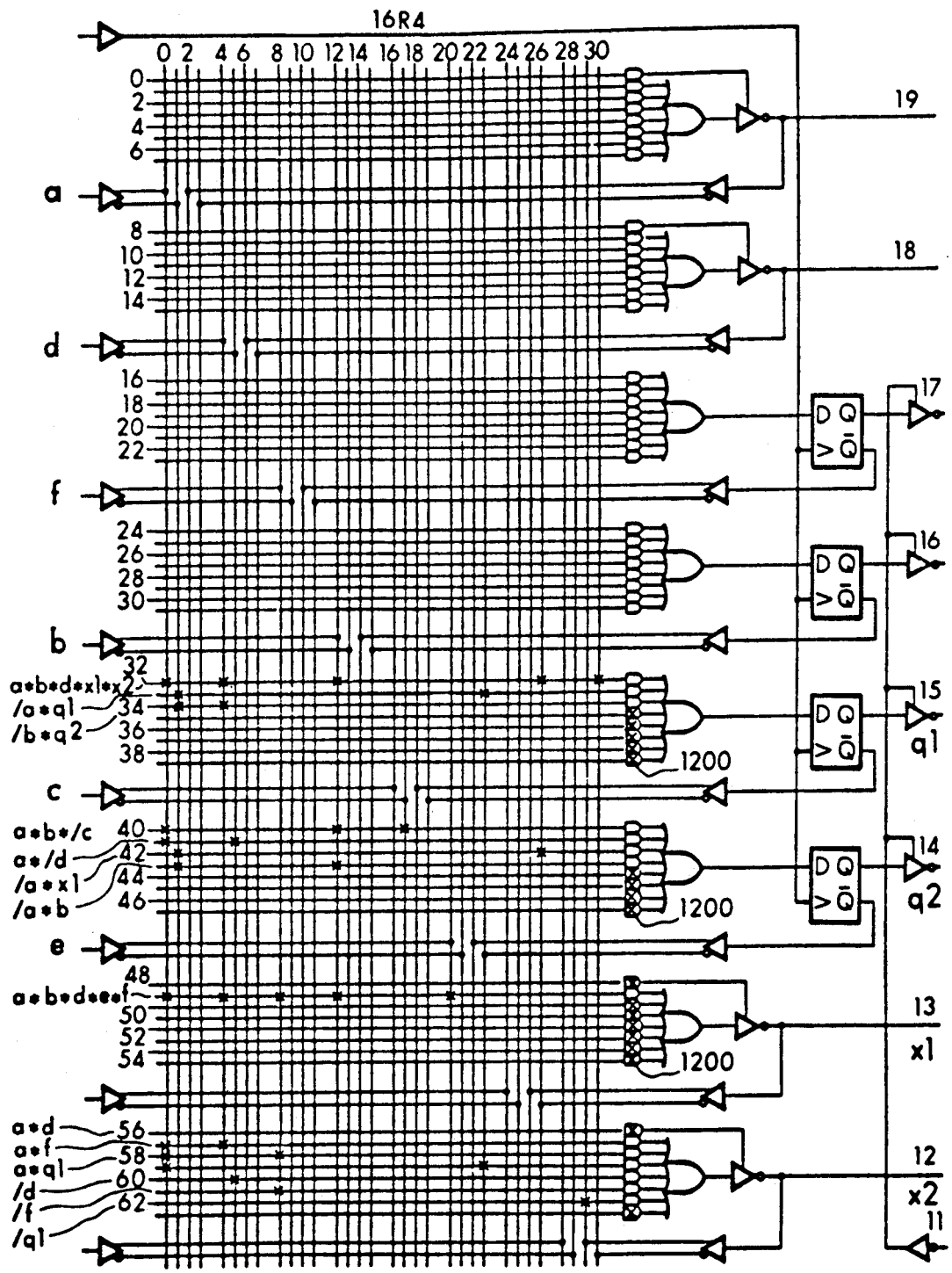
FIG. 12 sets forth the fuse map for fusing a conventional 16R4 Programmable Array Logic device.

In FIGS. 11 and 12 the details of the map process of the partitioning 340 of FIG. 4 is set forth. The map process 420 receives the solution list (for example Table XIII). In stage 1100, one of the solutions from the list is selected. As previously mentioned, any number of solutions could be present in the solution list. For example, the best solution having the lowest cost value in Table XIII is the 16R4 device. We will use the example of Table I for the following discussion of the map process 420. In stage 1102, the current device under consideration by the map process 420 is set to the first device in the selected solution which in this case is 16R4. In stage 1106 a determination is made as to whether or not fuse maps have already been generated for this particular device. It is to be understood that the map process 420 can selectively go through each of the solutions in the solutions list and there is no need to regenerate maps for a particular device.

In this case, the maps are generated in stage 1108 and the process returns. However, if in stage 1106 no maps are generated, then maps are to be generated in the following stages.

In stage 1110, the pnode for the current solution and the library list for the device including the pin assignment are obtained. The pins are then scanned on the device starting with the first pin. In stage 1120, a determination is made as to whether or not this is the last pin. If this is the last pin, stage 1122 is entered and the map is generated and then, in stage 1124, the next device is selected for mapping. However, the process starts with the first pin and hence if the answer is no (i.e., there are more pins) in stage 1120, a determination is made if the pin is an output pin or a input pin. This occurs in stage 1130. If it is an output pin, the output signal is placed on the pin in stage 1132 and then proceeds to obtain the next output pin in stage 1134. The process then repeats. However, if it is not an output pin in stage 1130 then stage 1140 is entered and if it is, stage 1142 places the input on the pin and the next pin in stage 1134 is obtained. This process repeats for pin by pin in a given device for each device in the solution list.

FIG. 12 sets forth the mapping of the 16R4 solution of the example of Table I. In FIG. 12, each pterm (i.e., a*b*d*x1*x2, etc.) is assigned to a row and is created based upon the fusing configuration shown from the assignment of the variables to pins (i.e., "a" to pin 2, etc.). Likewise, the outputs are assigned to pins (i.e., q2 to pin 15, etc.) The device of FIG. 12 is a 16R4 device made by Monolithic Memories as the Medium 20 Series.

It is to be expressly understood that the claimed invention is not to be limited to the description of the preferred embodiment but encompasses other modifications and alterations within the scope and spirit of the inventive concept.

APPENDIX

--- Symbol Table ---

```
a   [  5]        type I
b   [  6]        type I
c   [  7]        type I
d   [  8]        type I
e   [  9]        type I
f   [ 10]        type I
q1  [  1] +4  ·  type R  inputs  a b c d x1
q2  [  2] +3     type R  inputs  a b d q1 q2 x1 x2
x1  [  3] +1     type O  inputs  a b d e f
x2  [  4] +4     type O  inputs  a d f q1
```

Equation list
[ q1, q2, x1, x2 ]

---Pin map---

Output equation: q1
```
    PLE11R8 --  9  10 11 13 14 15 16 17
      P16R4 -- 14 15 16 17
      P16R8 -- 12 13 14 15 16 17 18 19
      PLS173 --
```

Output equation: q2
```
    PLE11R8 --  9  10 11 13 14 15 16 17
      P16R4 -- 14 15 16 17
      P16R8 -- 12 13 14 15 16 17 18 19
      PLS173 --
```

Output equation: x1
```
    PLE11R8 --
      P16R4 -- 12 13 18 19
      P16R8 --
      PLS173 -- 14 15 16 17 18 19 20 21 22 23
```

Output equation: x2
```
    PLE11R8 --
      P16R4 -- 12 13 18 19
      P16R8 --
      PLS173 -- 14 15 16 17 18 19 20 21 22 23
``` try_fixed( )

No output signals fixed to pins try_fixed: fail

Initial try – place output signals on device 1 in the current solution

1     try( 1, [] )

try selects the first entry in lib_list that can contain an output signal

2     try_device( 1, PLE11R8, [ 1] )

Initial state of the pNode and fvl list for the first device in the solution list

```
    --- Pnode ---
    | lib_index: 1
    |     pins:  . . . . . . . . . . . . . . . . . . . . . . . . .
    | input list:
    --------------
```

```
            ---fvl---
            | [ q1, AVAIL OUTPUT, -5, 0 ]
            | [ q2, AVAIL OUTPUT, -7, 0 ]
#3          | [ x2, ALWAYS INPUT, -4, 0 ]
            | [ x1, ALWAYS INPUT, -5, 0 ]
            ---------
``` fit_f selects the first output signal in fvl and places it on the device

4  `fit_f( PLE11R8[1] )`
5  `fit_f: q1 placed on pin 9 of PLE11R8` fa list reflects q1 assigned to device 1 in the current solution

6  `fa: q1:1 q2:-1 x1:-1 x2:-1` check that all must-be-inputs can be assigned

7
```
        assign_inputs: partial
           --- Pnode ---
           | lib_index: 1
           |      pins:  a b c d x1 . . . q1 . . . . . . . . . . . . . . . .
           | input list: a b c d x1
           -------------
        assign_inputs: inputs assigned
```

The new fvl reflects q1 assigned -- no avail output auxiliary signals

```
           ---fvl---
           | [ q2, AVAIL OUTPUT, 1, 0 ]
           | [ x1, ALWAYS INPUT, 1, 1 ]
#8         | [ x2, ALWAYS INPUT, 0, 0 ]
           | [ q1, ALREADY ASSIGNED, 5, 0 ]
           ---------
``` q1 placed, return to try_device to place other output signals

`fit_f: placed q1` try_device makes sure all signals needed can be assigned

9
```
        assign_inputs: final
           --- Pnode ---
           | lib_index: 1
           |      pins: a b c d x1 . . . q1 . . . . . . . . . . . . . . . .
           | input list: a b c d x1
           -------------
        assign_inputs: inputs assigned
```

Updated pnode and fvl list with q1 assigned

```
--- Pnode ---
| lib_index: 1
|     pins:  a b c d x1 . . . q1 . . . . . . . . . . . . . . . .
| input list:  a b c d x1
------------
---fvl---
| [ q2, AVAIL OUTPUT, 1, 0 ]
| [ x1, ALWAYS INPUT, 1, 1 ]
| [ x2, ALWAYS INPUT, 0, 0 ]
| [ q1, ALREADY ASSIGNED, 5, 0 ]
---------
```

10   Another call to fit_f to place new first output signal on fvl: q2

```
fit_f( PLE11R8[1] )
fit_f: q2 placed on pin 10 of PLE11R8
``` fa now reflects both q1 and q2 assigned to device 1 in current solution

```
fa: q1:1 q2:1 x1:-1 x2:-1
``` make sure must-be-inputs can be assigned

11
```
assign_inputs: partial
   --- Pnode ---
   | lib_index: 1
   |     pins:  a b c d x1 x2 . . q1 q2 . . . . . . . . . . . . . .
   | input list:  a b c d x1 q1 q2 x2
   ------------
assign_inputs: inputs assigned
```

New fvl with assignment of q2 -- no avail outputs left

12
```
---fvl---
| [ x2, ALWAYS INPUT, 2, 1 ]
| [ x1, ALWAYS INPUT, 1, 1 ]
| [ q2, ALREADY ASSIGNED, 7, 1 ]
| [ q1, ALREADY ASSIGNED, 5, 1 ]
---------
``` q2 placed on device 1

13   `fit_f: placed q2` make sure all needed signals assigned

`assign_inputs: final`

```
        --- Pnode ---
        | lib_index: 1
        |     pins:  a b c d x1 x2 . . q1 q2 . . . . . . . . . . . . . . .
        | input list:  a b c d x1 q1 q2 x2
        ------------ assign_inputs: inputs assigned

Final pNode and fvl list for device 1 as PLE11R8

--- Pnode ---
        | lib_index: 1
        |     pins:  a b c d x1 x2 . . q1 q2 . . . . . . . . . . . . . . .
        | input list:  a b c d x1 q1 q2 x2
        ------------
        ---fvl---
        | [ x2, ALWAYS INPUT, 2, 1 ]
        | [ x1, ALWAYS INPUT, 1, 1 ]
        | [ q2, ALREADY ASSIGNED, 7, 1 ]
        | [ q1, ALREADY ASSIGNED, 5, 1 ]
        ---------- still have output signals to assign (x1,x2) but cannot place them on
     this device, so try a new device that will be device 2 in the current solution
```

14
```
     try( 2, [ 1])

try selects first device in lib_list that will fit x1 or x2, so try
        try skips the PLE11R8 and uses P16R4
```

15
```
     try_device( 2, P16R4, [ 1, 2] )

Initial pNode and fvl list for this device

--- Pnode ---
        | lib_index: 2
        |     pins:  . . . . . . . . . . . . . . . . . . . . .
        | input list:
        ------------
        ---fvl---
```
16
```
        | [ x2, AVAIL OUTPUT, -4, 0 ]
        | [ x1, AVAIL OUTPUT, -5, 0 ]
        | [ q1, ALREADY ASSIGNED, -5, 0 ]
        | [ q2, ALREADY ASSIGNED, -7, 0 ]
        ---------- select first output signal (x2) and assign it to the device fit_f( P16R4 [2] )
```
17
```
     fit_f: x2 placed on pin 12 of P16R4
``` fa now reflects x2 assigned to device 2 in the solution list fa: q1:1 q2:1 x1:-1 x2:2 make sure must-be-inputs can be assigned

18
```
    assign_inputs: partial
      --- Pnode ---
      | lib_index: 2
      |     pins:  . a d f . . . . . . . . x2 . . . . . . . . . .
      | input list:  a d f q1
      ..............
    assign_inputs: inputs assigned
```

New fvl — x1 is not an auxiliary output signal for x2

19
```
    ---fvl---
    | [ x1, AVAIL OUTPUT, 1, 0 ]
    | [ q1, ALREADY ASSIGNED, -1, 1 ]
    | [ x2, ALREADY ASSIGNED, 4, 0 ]
    | [ q2, ALREADY ASSIGNED, -1, 0 ]
    ..........
``` x2 placed in device fit_f: placed x2 make sure all signals can be assigned

```
assign_inputs: final
  --- Pnode ---
  | lib_index: 2
  |     pins:  . a d f q1 . . . . . . x2 . . . . . . . . .
  | input list:  a d f q1
  ..............
assign_inputs: inputs assigned
```

Updated pNode and fvl with x2 assigned to device

```
--- Pnode ---
| lib_index: 2
|     pins:  . a d f q1 . . . . . . x2 . . . . . . . . .
| input list:  a d f q1
..............
---fvl---
| [ x1, AVAIL OUTPUT, 1, 0 ]
| [ q1, ALREADY ASSIGNED, -1, 1 ]
| [ x2, ALREADY ASSIGNED, 4, 0 ]
| [ q2, ALREADY ASSIGNED, -1, 0 ]
..........
```

Select first output signal from fvl and try to assign to device

```
fit_f( P16R4[2] )
fit_f: x1 placed on pin 13 of P16R4
``` fa reflects x1 assigned to device 2 in the current solution

```
fa: q1:1 q2:1 x1:2 x2:2
``` check that must-be-inputs can be assigned

20
```
assign_inputs: partial
--- Pnode ---
| lib_index: 2
|     pins:  . a d f q1 b e . . . . x2 x1 . . . . . . . .
| input list:  a d f q1 b e
-------------
assign_inputs: inputs assigned
```

New fvl with x2 assigned to device

```
---fvl---
| [ q1, ALREADY ASSIGNED, 1, 1 ]
| [ x1, ALREADY ASSIGNED, 5, 0 ]
| [ x2, ALREADY ASSIGNED, 4, 0 ]
| [ q2, ALREADY ASSIGNED, 1, 0 ]
---------
fit_f: placed x1
```

21  final assignment — make sure all signals can be assigned

```
assign_inputs: final
--- Pnode ---
| lib_index: 2
|     pins:  . a d f q1 b e . . . . x2 x1 . . . . . . . .
| input list:  a d f q1 b e
-------------
assign_inputs: inputs assigned
```

Final pnode and fvl for device 2 in the current solution

```
--- Pnode ---
| lib_index: 2
|     pins:  . a d f q1 b e . . . . x2 x1 . . . . . . . .
| input list:  a d f q1 b e
-------------
---fvl---
| [ q1, ALREADY ASSIGNED, 1, 1 ]
| [ x1, ALREADY ASSIGNED, 5, 0 ]
| [ x2, ALREADY ASSIGNED, 4, 0 ]
| [ q2, ALREADY ASSIGNED, 1, 0 ]
---------
``` all output signals marked already assigned in fvl so this is a solution
add this solution to the solution list add_soln( [ 1, 2] )

there are no solutions in the solution list yet, so this solution
      is one of the ten best so far; add it to the list — it will be
      first in the list with a cost of 178 (PLE11R8) + 240 (16R4) = 418 add_soln: soln added to list try_device: exit

22 try selects the next device from the lib_list that will fit one of
      x1 or x2, so try skips the P16R8 and selects the PLS173 try_device( 2, PLS173, [ 1, 4] )

Initial state of pnode and fvl for pls173 as the second device
      in the current solution --- Pnode ---
   | lib_index: 4
   |     pins: . . . . . . . . . . . . . . . . . . . . . . . . . .
   | input list:
   ............
   ---fvl---
   | [ x2, AVAIL OUTPUT, -4, 0 ]
   | [ x1, AVAIL OUTPUT, -5, 0 ]
   | [ q1, ALREADY ASSIGNED, -5, 0 ]
   | [ q2, ALREADY ASSIGNED, -7, 0 ]
   ..........

select first fvl output signal: x2 fit_f( PLS173[2] )
   fit_f: x2 placed on pin 14 of PLS173
   fa: q1:1 q2:1 x1:-1 x2:2
     assign_inputs: partial
       --- Pnode ---
       | lib_index: 4
       |     pins: a d f . . . . . . . . . . x2 . . . . . . . . . . .
       | input list: a d f q1
       ..............
     assign_inputs: inputs assigned
   fvl with x2 assigned ---fvl---
   | [ x1, AVAIL OUTPUT, 1, 0 ]
   | [ q1, ALREADY ASSIGNED, -1, 1 ]
   | [ x2, ALREADY ASSIGNED, 4, 0 ]
   | [ q2, ALREADY ASSIGNED, -1, 0 ]
   ..........

```
      fit_f: placed x2
assign_inputs: final
    --- Pnode ---
    | lib_index: 4
    |     pins:  a d f q1 . . . . . . . . . . x2 . . . . . . . . . . .
    | input list:  a d f q1
    ..............

assign_inputs: inputs assigned pnode and fvl with x2 assigned

--- Pnode ---
| lib_index: 4
|     pins:  a d f q1 . . . . . . . . . . x2 . . . . . . . . . .
| input list:  a d f q1
..............
---fvl---
|  [ x1, AVAIL OUTPUT, 1, 0 ]
|  [ q1, ALREADY ASSIGNED, -1, 1 ]
|  [ x2, ALREADY ASSIGNED, 4, 0 ]
|  [ q2, ALREADY ASSIGNED, -1, 0 ]
..........

select first output signal on fvl: x1 fit_f( PLS173[2] )
fit_f: x1 placed on pin 15 of PLS173
fa: q1:1 q2:1 x1:2 x2:2
   assign_inputs: partial
       --- Pnode ---
       | lib_index: 4
       |     pins:  a d f q1 b e . . . . . . . x2 x1 . . . . . . . . . .
       | input list:  a d f q1 b e
       ..............
   assign_inputs: inputs assigned
   ---fvl---
   |  [ q1, ALREADY ASSIGNED, 1, 1 ]
   |  [ x1, ALREADY ASSIGNED, 5, 0 ]
   |  [ x2, ALREADY ASSIGNED, 4, 0 ]
   |  [ q2, ALREADY ASSIGNED, 1, 0 ]
   ..........

fit_f: placed x1 assign_inputs: final
       --- Pnode ---
       | lib_index: 4
       |     pins:  a d f q1 b e . . . . . . . x2 x1 . . . . . . . . . .
       | input list:  a d f q1 b e
       ..............
   assign_inputs: inputs assigned pnode and fvl with x1 assigned
```

```
--- Pnode ---
|  lib_index: 4
|       pins:  a d f q1 b e . . . . . . . x2 x1 . . . . . . . . . .
| input list:  a d f q1 b e
............
---fvl---
|  [ q1, ALREADY ASSIGNED, 1, 1 ]
|  [ x1, ALREADY ASSIGNED, 5, 0 ]
|  [ x2, ALREADY ASSIGNED, 4, 0 ]
|  [ q2, ALREADY ASSIGNED, 1, 0 ]
..........
```

All fvl entries are assigned, so this is a solution add_soln( [ 1, 4] )

only one solution in list, so this is one of the ten best,
add it to the list — it will be second in the list with
a cost of 178 (PLE11R8) + 522 (PLS173) = 700, which is greater
than the cost of the solution in the list: 418 add_soln: soln added to list
try_device: exit

At this point we have tried all four devices as the second device
in the current solution (the two with only registers could not
be used) so we back out and try a new first device try: exit
try_device: exit the outermost try selects a P16R4 as a first device — all output
signals are marked as available try_device( 1, P16R4, [ 2] )

Initial pnode and fvl for this device — note that since this device
has both types of outputs, all the output signals are avail output
on this device

```
--- Pnode ---
|  lib_index: 2
|       pins:  . . . . . . . . . . . . . . . . . . . . . .
| input list:
............
---fvl---
|  [ x2, AVAIL OUTPUT, -4, 0 ]
|  [ x1, AVAIL OUTPUT, -5, 0 ]
|  [ q1, AVAIL OUTPUT, -5, 0 ]
|  [ q2, AVAIL OUTPUT, -7, 0 ]
..........
``` fit the first output signal in the fvl: x2

```
fit_f( P16R4[1] )
fit_f: x2 placed on pin 12 of P16R4 show x2 assigned to device 1 in the current solution fa: q1:-1 q2:-1 x1:-1 x2:1 assign_inputs: partial
    --- Pnode ---
    | lib_index: 2
    |      pins: . a d f . . . . . . . x2 . . . . . . . . .
    | input list: a d f q1
    .............
  assign_inputs: inputs assigned
  ---fvl---
  | [ q1, AVAIL OUTPUT, -1, 1 ]
  | [ x1, AVAIL OUTPUT, 1, 0 ]
  | [ q2, AVAIL OUTPUT, -1, 0 ]
  | [ x2, ALREADY ASSIGNED, 4, 0 ]
  ..........

q1 is used as an input to x2, so q1 is an auxiliary output signal
    for x2. q1 is selected for fitting at this point and placed on
    the device assigning q1 to pin 14
fit_f: aux q1 placed on pin 14 of P16R4
fa: q1:1 q2:-1 x1:-1 x2:1
  assign_inputs: partial
    --- Pnode ---
    | lib_index: 2
    |      pins: . a d f b c . . . . . x2 . q1 . . . . . . .
    | input list: a d f q1 b c x1
    .............
  assign_inputs: inputs assigned ---fvl---
  | [ x1, AVAIL OUTPUT, 3, 1 ]
  | [ q2, AVAIL OUTPUT, 3, 0 ]
  | [ q1, ALREADY ASSIGNED, 5, 1 ]
  | [ x2, ALREADY ASSIGNED, 4, 0 ]
  ..........

x1 is used as an input signal by q1 and is an auxiliary output signal
    for q1 — x1 is placed on the device at this point assigning x1 to pin 13
fit_f: aux x1 placed on pin 13 of P16R4
fa: q1:1 q2:-1 x1:1 x2:1
  assign_inputs: partial
```

```
--- Pnode ---
| lib_index: 2
|      pins:  . a d f b c e . . . . x2 x1 q1 . . . . . . .
| input list:  a d f q1 b c x1 e
.............
assign_inputs: inputs assigned
---fvl---
| [ q2, AVAIL OUTPUT, 3, 0 ]
| [ x1, ALREADY ASSIGNED, 5, 1 ]
| [ q1, ALREADY ASSIGNED, 5, 1 ]
| [ x2, ALREADY ASSIGNED, 4, 0 ]
.........
fit_f: placed x2
```

Now the initial output signal x2 and all the auxiliaries q1 and x1
   have been placed on the device - check that the input signals
   can be assigned and continue

```
assign_inputs: final
   --- Pnode ---
   | lib_index: 2
   |      pins:  . a d f b c e . . . . x2 x1 q1 . . . . . . .
   | input list:  a d f q1 b c x1 e
   .............
assign_inputs: inputs assigned
``` pnode and fvl reflecting assignment of x1, x2 and q1

```
--- Pnode ---
| lib_index: 2
|      pins:  . a d f b c e . . . . x2 x1 q1 . . . . . . .
| input list:  a d f q1 b c x1 e
.............
---fvl---
| [ q2, AVAIL OUTPUT, 3, 0 ]
| [ x1, ALREADY ASSIGNED, 5, 1 ]
| [ q1, ALREADY ASSIGNED, 5, 1 ]
| [ x2, ALREADY ASSIGNED, 4, 0 ]
.........
``` select the first fvl list entry: q2 and assign to the device

```
fit_f( P16R4[1] )
fit_f: q2 placed on pin 15 of P16R4
fa: q1:1 q2:1 x1:1 x2:1
   assign_inputs: partial
      --- Pnode ---
      | lib_index: 2
      |      pins:  . a d f b c e . . . . x2 x1 q1 q2 . . . . .
      | input list:  a d f q1 b c x1 e q2 x2
      .............
   assign_inputs: inputs assigned
```

```
---fvl---
|  [ q2, ALREADY ASSIGNED, 7, 1 ]
|  [ x1, ALREADY ASSIGNED, 5, 1 ]
|  [ q1, ALREADY ASSIGNED, 5, 1 ]
|  [ x2, ALREADY ASSIGNED, 4, 1 ]
 --------- fit_f: placed q2
assign_inputs: final
  --- Pnode ---
  | lib_index: 2
  |     pins:  . a d f b c e . . . . x2 x1 q1 q2 . . . . .
  | input list:  a d f q1 b c x1 e q2 x2
   ------------- assign_inputs: inputs assigned

Final pnode and fvl for this device

--- Pnode ---
 | lib_index: 2
 |     pins:  . a d f b c e . . . . x2 x1 q1 q2 . . . . .
 | input list:  a d f q1 b c x1 e q2 x2
  -------------
 ---fvl---
 |  [ q2, ALREADY ASSIGNED, 7, 1 ]
 |  [ x1, ALREADY ASSIGNED, 5, 1 ]
 |  [ q1, ALREADY ASSIGNED, 5, 1 ]
 |  [ x2, ALREADY ASSIGNED, 4, 1 ]
  ---------
``` all the output signals have been assigned to this device -- this is a
   solution so try to add it to the solution list

```
add_soln( [ 2] )
``` there are only two solutions in the list so this is one of the ten
   best so far -- add it to the solution list with a cost
   of 240 (P16R4) -- this is less than either of the two solutions
   in the list (418, 700) so this will be solution 1 and the others
   will sort to solution 2 (PLE11R8/P16R4) and
   solution 3 (PLE11R8/PLS173)

```
  add_soln: soln added to list try_device: exit
``` try selects the next device in lib_list: P16R8

```
try_device( 1, P16R8, [ 3] )
   --- Pnode ---
   | lib_index: 3
   |     pins:  . . . . . . . . . . . . . . . . . . . .
   | input list:
    -------------
```

```
---fvl---
| [ q1, AVAIL OUTPUT, -5, 0 ]
| [ q2, AVAIL OUTPUT, -7, 0 ]
| [ x2, ALWAYS INPUT, -4, 0 ]
| [ x1, ALWAYS INPUT, -5, 0 ]
--------- fit_f( P16R8[1] )
fit_f: q1 placed on pin 12 of P16R8
fa: q1:1 q2:-1 x1:-1 x2:-1
  assign_inputs: partial
    --- Pnode ---
    | lib_index: 3
    |     pins: . a b c d x1 . . . . . q1 . . . . . . . . .
    | input list: a b c d x1
    -------------
  assign_inputs: inputs assigned
  ---fvl---
  | [ q2, AVAIL OUTPUT, 1, 0 ]
  | [ x1, ALWAYS INPUT, 1, 1 ]
  | [ x2, ALWAYS INPUT, 0, 0 ]
  | [ q1, ALREADY ASSIGNED, 5, 0 ]
  ---------
  fit_f: placed q1
assign_inputs: final
  --- Pnode ---
  | lib_index: 3
  |     pins: . a b c d x1 . . . . . q1 . . . . . . . . .
  | input list: a b c d x1
  -------------
assign_inputs: inputs assigned
--- Pnode ---
| lib_index: 3
|     pins: . a b c d x1 . . . . . q1 . . . . . . . . .
| input list: a b c d x1
-------------
---fvl---
| [ q2, AVAIL OUTPUT, 1, 0 ]
| [ x1, ALWAYS INPUT, 1, 1 ]
| [ x2, ALWAYS INPUT, 0, 0 ]
| [ q1, ALREADY ASSIGNED, 5, 0 ]
---------
fit_f( P16R8[1] )
fit_f: q2 placed on pin 13 of P16R8
fa: q1:1 q2:1 x1:-1 x2:-1
  assign_inputs: partial
    --- Pnode ---
    | lib_index: 3
    |     pins: . a b c d x1 x2 . . . . q1 q2 . . . . . . .
    | input list: a b c d x1 q1 q2 x2
    -------------
  assign_inputs: inputs assigned
```

```
---fvl---
| [ x2, ALWAYS INPUT, 2, 1 ]
| [ x1, ALWAYS INPUT, 1, 1 ]
| [ q2, ALREADY ASSIGNED, 7, 1 ]
| [ q1, ALREADY ASSIGNED, 5, 1 ]
..........

fit_f: placed q2
assign_inputs: final
    --- Pnode ---
    | lib_index: 3
    |      pins:  . a b c d x1 x2 . . . . q1 q2 . . . . . . . .
    | input list:  a b c d x1 q1 q2 x2
    ..............

assign_inputs: inputs assigned
--- Pnode ---
| lib_index: 3
|      pins:  . a b c d x1 x2 . . . . q1 q2 . . . . . . . .
| input list:  a b c d x1 q1 q2 x2
..............

---fvl---
| [ x2, ALWAYS INPUT, 2, 1 ]
| [ x1, ALWAYS INPUT, 1, 1 ]
| [ q2, ALREADY ASSIGNED, 7, 1 ]
| [ q1, ALREADY ASSIGNED, 5, 1 ]
..........

try( 2, [ 3] )
    try_device( 2, P16R4, [ 3, 2] )
        --- Pnode ---
        | lib_index: 2
        |      pins:  . . . . . . . . . . . . . . . . . . . . .
        | input list:
        ..............

---fvl---
        | [ x2, AVAIL OUTPUT, -4, 0 ]
        | [ x1, AVAIL OUTPUT, -5, 0 ]
        | [ q1, ALREADY ASSIGNED, -5, 0 ]
        | [ q2, ALREADY ASSIGNED, -7, 0 ]
        ..........

fit_f( P16R4[2] )
fit_f: x2 placed on pin 12 of P16R4
fa: q1:1 q2:1 x1:-1 x2:2
    assign_inputs: partial
        --- Pnode ---
        | lib_index: 2
        |      pins:  . a d f . . . . . . . . x2 . . . . . . . . .
        | input list:  a d f q1
        ..............

assign_inputs: inputs assigned
    ---fvl---
    | [ x1, AVAIL OUTPUT, 1, 0 ]
    | [ q1, ALREADY ASSIGNED, -1, 1 ]
```

```
    | [ x2, ALREADY ASSIGNED, 4, 0 ]
    | [ q2, ALREADY ASSIGNED, -1, 0 ]
    ..........
    fit_f: placed x2
assign_inputs: final
   --- Pnode ---
   | lib_index: 2
   |      pins:  . a d f q1 . . . . . . . x2 . . . . . . . . .
   | input list: a d f q1
   ..............
assign_inputs: inputs assigned
--- Pnode ---
| lib_index: 2
|      pins:  . a d f q1 . . . . . . . x2 . . . . . . . . .
| input list: a d f q1
..............
---fvl---
| [ x1, AVAIL OUTPUT, 1, 0 ]
| [ q1, ALREADY ASSIGNED, -1, 1 ]
| [ x2, ALREADY ASSIGNED, 4, 0 ]
| [ q2, ALREADY ASSIGNED, -1, 0 ]
..........

fit_f( P16R4[2] )
fit_f: x1 placed on pin 13 of P16R4
fa: q1:1 q2:1 x1:2 x2:2
   assign_inputs: partial
      --- Pnode ---
      | lib_index: 2
      |      pins:  . a d f q1 b e . . . . x2 x1 . . . . . . . .
      | input list: a d f q1 b e
      ..............
   assign_inputs: inputs assigned
   ---fvl---
   | [ q1, ALREADY ASSIGNED, 1, 1 ]
   | [ x1, ALREADY ASSIGNED, 5, 0 ]
   | [ x2, ALREADY ASSIGNED, 4, 0 ]
   | [ q2, ALREADY ASSIGNED, 1, 0 ]
   ..........
   fit_f: placed x1
assign_inputs: final
   --- Pnode ---
   | lib_index: 2
   |      pins:  . a d f q1 b e . . . . x2 x1 . . . . . . . .
   | input list: a d f q1 b e
   ..............
assign_inputs: inputs assigned
--- Pnode ---
| lib_index: 2
|      pins:  . a d f q1 b e . . . . x2 x1 . . . . . . . .
| input list: a d f q1 b e
..............
```

```
   ---fvl---
   | [ q1, ALREADY ASSIGNED, 1, 1 ]
   | [ x1, ALREADY ASSIGNED, 5, 0 ]
   | [ x2, ALREADY ASSIGNED, 4, 0 ]
   | [ q2, ALREADY ASSIGNED, 1, 0 ]
   ..........
add_soln( [ 3, 2] )
   add_soln: soln added to list
try_device: exit
try_device( 2, PLS173, [ 3, 4] )
   --- Pnode ---
   | lib_index: 4
   |     pins: . . . . . . . . . . . . . . . . . . . . . . .
   | input list:
   ..............
   ---fvl---
   | [ x2, AVAIL OUTPUT, -4, 0 ]
   | [ x1, AVAIL OUTPUT, -5, 0 ]
   | [ q1, ALREADY ASSIGNED, -5, 0 ]
   | [ q2, ALREADY ASSIGNED, -7, 0 ]
   ..........
   fit_f( PLS173[2] )
   fit_f: x2 placed on pin 14 of PLS173
   fa: q1:1 q2:1 x1:-1 x2:2
      assign_inputs: partial
         --- Pnode ---
         | lib_index: 4
         |     pins: a d f . . . . . . . . . . . x2 . . . . . . . . . . .
         | input list: a d f q1
         ..............
      assign_inputs: inputs assigned
      ---fvl---
      | [ x1, AVAIL OUTPUT, 1, 0 ]
      | [ q1, ALREADY ASSIGNED, -1, 1 ]
      | [ x2, ALREADY ASSIGNED, 4, 0 ]
      | [ q2, ALREADY ASSIGNED, -1, 0 ]
      ..........
      fit_f: placed x2 assign_inputs: final
      --- Pnode ---
      | lib_index: 4
      |     pins: a d f q1 . . . . . . . . . . x2 . . . . . . . . . .
      | input list: a d f q1
      ..............
   assign_inputs: inputs assigned
   --- Pnode ---
   | lib_index: 4
   |     pins: a d f q1 . . . . . . . . . . x2 . . . . . . . . . . .
   | input list: a d f q1
   ..............
```

```
---fvl---
| [ x1, AVAIL OUTPUT, 1, 0 ]
| [ q1, ALREADY ASSIGNED, -1, 1 ]
| [ x2, ALREADY ASSIGNED, 4, 0 ]
| [ q2, ALREADY ASSIGNED, -1, 0 ]
----------
fit_f( PLS173[2] )
fit_f: x1 placed on pin 15 of PLS173
fa: q1:1 q2:1 x1:2 x2:2
  assign_inputs: partial
    --- Pnode ---
    | lib_index: 4
    |     pins: a d f q1 b e . . . . . . . . x2 x1 . . . . . . . . . .
    | input list: a d f q1 b e
    ------------
  assign_inputs: inputs assigned
  ---fvl---
  | [ q1, ALREADY ASSIGNED, 1, 1 ]
  | [ x1, ALREADY ASSIGNED, 5, 0 ]
  | [ x2, ALREADY ASSIGNED, 4, 0 ]
  | [ q2, ALREADY ASSIGNED, 1, 0 ]
  ----------
  fit_f: placed x1
assign_inputs: final
  --- Pnode ---
  | lib_index: 4
  |     pins: a d f q1 b e . . . . . . . x2 x1 . . . . . . . . . .
  | input list: a d f q1 b e
  ------------
assign_inputs: inputs assigned
--- Pnode ---
| lib_index: 4
|     pins: a d f q1 b e . . . . . . . x2 x1 . . . . . . . . . .
| input list: a d f q1 b e
------------
---fvl---
| [ q1, ALREADY ASSIGNED, 1, 1 ]
| [ x1, ALREADY ASSIGNED, 5, 0 ]
| [ x2, ALREADY ASSIGNED, 4, 0 ]
| [ q2, ALREADY ASSIGNED, 1, 0 ]
----------
    add_soln( [ 3, 4] )
      add_soln: soln added to list
    try_device: exit
  try: exit
try_device: exit try selects the last device in the lib_list: PLS173 try_device( 1, PLS173, [ 4] )
  --- Pnode ---
  | lib_index: 4
```

```
|       pins: . . . . . . . . . . . . . . . . . . . . . . . . . . .
| input list:
 . . . . . . . . . . . .
---fvl---
|  [ x2, AVAIL OUTPUT, -4, 0 ]
|  [ x1, AVAIL OUTPUT, -5, 0 ]
|  [ q1, ALWAYS INPUT, -5, 0 ]
|  [ q2, ALWAYS INPUT, -7, 0 ]
 . . . . . . . . .
fit_f( PLS173[1] )
fit_f: x2 placed on pin 14 of PLS173
fa: q1:-1 q2:-1 x1:-1 x2:1
  assign_inputs: partial
     --- Pnode ---
     |  lib_index: 4
     |      pins: a d f q1 . . . . . . . . . . x2 . . . . . . . . . .
     | input list: a d f q1
      . . . . . . . . . . .
  assign_inputs: inputs assigned
  ---fvl---
  |  [ x1, AVAIL OUTPUT, 1, 0 ]
  |  [ q1, ALWAYS INPUT, -1, 1 ]
  |  [ q2, ALWAYS INPUT, -1, 0 ]
  |  [ x2, ALREADY ASSIGNED, 4, 0 ]
   . . . . . . . . .
  fit_f: placed x2
assign_inputs: final
  --- Pnode ---
  |  lib_index: 4
  |      pins: a d f q1 . . . . . . . . . . x2 . . . . . . . . . .
  | input list: a d f q1
   . . . . . . . . . . .
assign_inputs: inputs assigned
--- Pnode ---
|  lib_index: 4
|      pins: a d f q1 . . . . . . . . . . x2 . . . . . . . . . .
| input list: a d f q1
 . . . . . . . . . . .
---fvl---
|  [ x1, AVAIL OUTPUT, 1, 0 ]
|  [ q1, ALWAYS INPUT, -1, 1 ]
|  [ q2, ALWAYS INPUT, -1, 0 ]
|  [ x2, ALREADY ASSIGNED, 4, 0 ]
 . . . . . . . . .
fit_f( PLS173[1] )
fit_f: x1 placed on pin 15 of PLS173
fa: q1:-1 q2:-1 x1:1 x2:1
  assign_inputs: partial
     --- Pnode ---
     |  lib_index: 4
     |      pins: a d f q1 b e . . . . . . . . x2 x1 . . . . . . . . . .
```

```
    | input list:  a d f q1 b e
    ..............

assign_inputs: inputs assigned
    ---fvl---
    | [ q1, ALWAYS INPUT, 1, 1 ]
    | [ q2, ALWAYS INPUT, 1, 0 ]
    | [ x1, ALREADY ASSIGNED, 5, 0 ]
    | [ x2, ALREADY ASSIGNED, 4, 0 ]
    ..........

fit_f: placed x1
assign_inputs: final
    --- Pnode ---
    | lib_index: 4
    |     pins:  a d f q1 b e . . . . . . . . x2 x1 . . . . . . . . . .
    | input list:  a d f q1 b e
    ..............

assign_inputs: inputs assigned
  --- Pnode ---
  | lib_index: 4
  |     pins:  a d f q1 b e . . . . . . . . x2 x1 . . . . . . . . . .
  | input list:  a d f q1 b e
    ..............

---fvl---
  | [ q1, ALWAYS INPUT, 1, 1 ]
  | [ q2, ALWAYS INPUT, 1, 0 ]
  | [ x1, ALREADY ASSIGNED, 5, 0 ]
  | [ x2, ALREADY ASSIGNED, 4, 0 ]
  ..........

try( 2, [ 4])
  try_device( 2, PLE11R8, [ 4, 1] )
    --- Pnode ---
    | lib_index: 1
    |     pins:  . . . . . . . . . . . . . . . . . . . . . . . . .
    | input list:
    ..............

---fvl---
    | [ q1, AVAIL OUTPUT, -5, 0 ]
    | [ q2, AVAIL OUTPUT, -7, 0 ]
    | [ x2, ALREADY ASSIGNED, -4, 0 ]
    | [ x1, ALREADY ASSIGNED, -5, 0 ]
    .........

fit_f( PLE11R8[..] );
fit_f: q1 placed on pin 9 of PLE11R8
fa: q1:2 q2:-1 x1:1 x2:1
  assign_inputs: partial
    --- Pnode ---
    | lib_index: 1
    |     pins:  a b c d . . . . q1 . . . . . . . . . . . . . . .
    | input list:  a b c d x1
    ..............

assign_inputs: inputs assigned
```

```
---fvl---
| [ q2, AVAIL OUTPUT, 1, 0 ]
| [ x1, ALREADY ASSIGNED, 1, 1 ]
| [ q1, ALREADY ASSIGNED, 5, 0 ]
| [ x2, ALREADY ASSIGNED, 0, 0 ]
----------
  fit_f: placed q1
assign_inputs: final
  --- Pnode ---
  | lib_index: 1
  |     pins: a b c d x1 . . . q1 . . . . . . . . . . . . . . . .
  | input list: a b c d x1
  ------------- assign_inputs: inputs assigned
--- Pnode ---
| lib_index: 1
|     pins: a b c d x1 . . . q1 . . . . . . . . . . . . . . . .
| input list: a b c d x1
-------------

---fvl---
| [ q2, AVAIL OUTPUT, 1, 0 ]
| [ x1, ALREADY ASSIGNED, 1, 1 ]
| [ q1, ALREADY ASSIGNED, 5, 0 ]
| [ x2, ALREADY ASSIGNED, 0, 0 ]
---------- fit_f( PLE11R8[2] )
fit_f: q2 placed on pin 10 of PLE11R8
fa: q1:2 q2:2 x1:1 x2:1
  assign_inputs: partial
    --- Pnode ---
    | lib_index: 1
    |     pins: a b c d x1 . . . q1 q2 . . . . . . . . . . . . . .
    | input list: a b c d x1 q1 q2 x2
    ------------- assign_inputs: inputs assigned
  ---fvl---
  | [ q2, ALREADY ASSIGNED, 7, 1 ]
  | [ q1, ALREADY ASSIGNED, 5, 1 ]
  | [ x2, ALREADY ASSIGNED, 2, 1 ]
  | [ x1, ALREADY ASSIGNED, 1, 1 ]
  ----------
  fit_f: placed q2
assign_inputs: final
  --- Pnode ---
  | lib_index: 1
  |     pins: a b c d x1 x2 . . q1 q2 . . . . . . . . . . . . . .
  | input list: a b c d x1 q1 q2 x2
  ------------- assign_inputs: inputs assigned
--- Pnode ---
| lib_index: 1
```

```
|     pins:  a b c d x1 x2 . . q1 q2 . . . . . . . . . . . . . . .
| input list: a b c d x1 q1 q2 x2
 -------------
---fvl---
| [ q2, ALREADY ASSIGNED, 7, 1 ]
| [ q1, ALREADY ASSIGNED, 5, 1 ]
| [ x2, ALREADY ASSIGNED, 2, 1 ]
| [ x1, ALREADY ASSIGNED, 1, 1 ]
 --------- add_soln( [ 4, 1] )
  add_soln: soln added to list
try_device: exit
try_device( 2, P16R4, [ 4, 2] )
  --- Pnode ---
  | lib_index: 2
  |     pins:  . . . . . . . . . . . . . . . . . . . .
  | input list:
   -------------
  ---fvl---
  | [ q1, AVAIL OUTPUT, -5, 0 ]
  | [ q2, AVAIL OUTPUT, -7, 0 ]
  | [ x2, ALREADY ASSIGNED, -4, 0 ]
  | [ x1, ALREADY ASSIGNED, -5, 0 ]
   --------- fit_f( P16R4[2] )
  fit_f: q1 placed on pin 14 of P16R4
  fa: q1:2 q2:-1 x1:1 x2:1
    assign_inputs: partial
      --- Pnode ---
      | lib_index: 2
      |     pins:  . a b c d . . . . . . . . q1 . . . . . . .
      | input list: a b c d x1
       ------------- assign_inputs: inputs assigned
    ---fvl---
    | [ q2, AVAIL OUTPUT, 1, 0 ]
    | [ x1, ALREADY ASSIGNED, 1, 1 ]
    | [ q1, ALREADY ASSIGNED, 5, 0 ]
    | [ x2, ALREADY ASSIGNED, 0, 0 ]
     --------- fit_f: placed q1
    assign_inputs: final
      --- Pnode ---
      | lib_index: 2
      |     pins:  . a b c d x1 . . . . . . . q1 . . . . . . .
      | input list: a b c d x1
       ------------- assign_inputs: inputs assigned
    --- Pnode ---
    | lib_index: 2
    |     pins:  . a b c d x1 . . . . . . . q1 . . . . . . .
```

```
| input list:  a b c d x1
 ..............
---fvl---
|  [ q2, AVAIL OUTPUT, 1, 0 ]
|  [ x1, ALREADY ASSIGNED, 1, 1 ]
|  [ q1, ALREADY ASSIGNED, 5, 0 ]
|  [ x2, ALREADY ASSIGNED, 0, 0 ]
..........
fit_f( P16R4[2] )
fit_f: q2 placed on pin 15 of P16R4
fa: q1:2 q2:2 x1:1 x2:1
  assign_inputs: partial
    --- Pnode ---
    | lib_index: 2
    |      pins:  . a b c d x1 . . . . . . . . q1 q2 . . . . . .
    | input list:  a b c d x1 q1 q2 x2
     ..............
  assign_inputs: inputs assigned
   ---fvl---
   |  [ q2, ALREADY ASSIGNED, 7, 1 ]
   |  [ q1, ALREADY ASSIGNED, 5, 1 ]
   |  [ x2, ALREADY ASSIGNED, 2, 1 ]
   |  [ x1, ALREADY ASSIGNED, 1, 1 ]
   ..........
  fit_f: placed q2
assign_inputs: final
  --- Pnode ---
  | lib_index: 2
  |      pins:  . a b c d x1 x2 . . . . . . q1 q2 . . . . .
  | input list:  a b c d x1 q1 q2 x2
   ..............
assign_inputs: inputs assigned
--- Pnode ---
| lib_index: 2
|      pins:  . a b c d x1 x2 . . . . . . q1 q2 . . . . .
| input list:  a b c d x1 q1 q2 x2
 ..............
---fvl---
|  [ q2, ALREADY ASSIGNED, 7, 1 ]
|  [ q1, ALREADY ASSIGNED, 5, 1 ]
|  [ x2, ALREADY ASSIGNED, 2, 1 ]
|  [ x1, ALREADY ASSIGNED, 1, 1 ]
  ..........
  add_soln( [ 4, 2] )
    add_soln: soln added to list
  try_device: exit
  try_device( 2, P16R8, [ 4, 3] )
    --- Pnode ---
    | lib_index: 3
    |      pins:  . . . . . . . . . . . . . . . . . . . .
    | input list:
     ..............
```

```
---fvl---
| [ q1, AVAIL OUTPUT, -5, 0 ]
| [ q2, AVAIL OUTPUT, -7, 0 ]
| [ x2, ALREADY ASSIGNED, -4, 0 ]
| [ x1, ALREADY ASSIGNED, -5, 0 ]
---------- fit_f( P16R8[2] )
fit_f: q1 placed on pin 12 of P16R8
fa: q1:2 q2:-1 x1:1 x2:1
  assign_inputs: partial
    --- Pnode ---
    | lib_index: 3
    |      pins: . a b c d . . . . . . q1 . . . . . . . . .
    | input list: a b c d x1
    ------------- assign_inputs: inputs assigned
    ---fvl---
    | [ q2, AVAIL OUTPUT, 1, 0 ]
    | [ x1, ALREADY ASSIGNED, 1, 1 ]
    | [ q1, ALREADY ASSIGNED, 5, 0 ]
    | [ x2, ALREADY ASSIGNED, 0, 0 ]
    ---------- fit_f: placed q1
assign_inputs: final
  --- Pnode ---
  | lib_index: 3
  |      pins: . a b c d x1 . . . . . q1 . . . . . . . . .
  | input list: a b c d x1
  ------------- assign_inputs: inputs assigned
--- Pnode ---
| lib_index: 3
|      pins: . a b c d x1 . . . . . q1 . . . . . . . . .
| input list: a b c d x1
-------------

---fvl---
| [ q2, AVAIL OUTPUT, 1, 0 ]
| [ x1, ALREADY ASSIGNED, 1, 1 ]
| [ q1, ALREADY ASSIGNED, 5, 0 ]
| [ x2, ALREADY ASSIGNED, 0, 0 ]
---------- fit_f( P16R8[2] )
  fit_f: q2 placed on pin 13 of P16R8
  fa: q1:2 q2:2 x1:1 x2:1 assign_inputs: partial
  --- Pnode ---
  | lib_index: 3
  |      pins: . a b c d x1 . . . . . q1 q2 . . . . . . . .
  | input list: a b c d x1 q1 q2 x2
  ------------- assign_inputs: inputs assigned
```

```
        ---fvl---
        | [ q2, ALREADY ASSIGNED, 7, 1 ]
        | [ q1, ALREADY ASSIGNED, 5, 1 ]
        | [ x2, ALREADY ASSIGNED, 2, 1 ]
        | [ x1, ALREADY ASSIGNED, 1, 1 ]
        ----------
       fit_f: placed q2
      assign_inputs: final
        --- Pnode ---
        | lib_index: 3
        |     pins: . a b c d x1 x2 . . . . q1 q2 . . . . . . . .
        | input list: a b c d x1 q1 q2 x2
        ---------------
      assign_inputs: inputs assigned
        --- Pnode ---
        | lib_index: 3
        |     pins: . a b c d x1 x2 . . . . q1 q2 . . . . . . . .
        | input list: a b c d x1 q1 q2 x2
        ---------------
        ---fvl---
        | [ q2, ALREADY ASSIGNED, 7, 1 ]
        | [ q1, ALREADY ASSIGNED, 5, 1 ]
        | [ x2, ALREADY ASSIGNED, 2, 1 ]
        | [ x1, ALREADY ASSIGNED, 1, 1 ]
        ----------
      add_soln( [ 4, 3] )
        add_soln: soln added to list
      try_device: exit
     try: exit
    try_device: exit all devices have been used as the first device, so all solutions
     have been generated at this point - exit try and output
     the solution list try: exit --- Solution list --- solution 1  cost 240
     device list: P16R4
 eqn assignments: q1:P16R4[1] q2:P16R4[1] x1:P16R4[1] x2:P16R4[1]

solution 2  cost 418
     device list: PLE11R8 P16R4
 eqn assignments: q1:PLE11R8[1] q2:PLE11R8[1] x1:P16R4[2] x2:P16R4[2]

solution 3  cost 480
     device list: P16R8 P16R4
 eqn assignments: q1:P16R8[1] q2:P16R8[1] x1:P16R4[2] x2:P16R4[2]

solution 4  cost 700
```

```
device list: PLE11R8 PLS173
eqn assignments: q1:PLE11R8[1] q2:PLE11R8[1] x1:PLS173[2] x2:PLS173[2]

solution 5 cost 700
    device list: PLS173 PLE11R8
    eqn assignments: q1:PLE11R8[2] q2:PLE11R8[2] x1:PLS173[1] x2:PLS173[1]

solution 6 cost 762
    device list: P16R8 PLS173
    eqn assignments: q1:P16R8[1] q2:P16R8[1] x1:PLS173[2] x2:PLS173[2]

solution 7 cost 762
    device list: PLS173 P16R4
    eqn assignments: q1:P16R4[2] q2:P16R4[2] x1:PLS173[1] x2:PLS173[1]

solution 8 cost 762
    device list: PLS173 P16R8
    eqn assignments: q1:P16R8[2] q2:P16R8[2] x1:PLS173[1] x2:PLS173[1]
```

We claim:

1. An automated partitioning method for implementing, on a processor, a given set of Boolean logic equations to one or a plurality of discrete manufactured physical logic devices, each of said discrete manufactured physical logic devices having an architectural type number, pins, pin assignments, manufacturer identity, model number, and price, said processor having an input, a memory, and an output, said method comprising the steps of:

storing template information on different architectural types of said discrete manufactured physical logic devices in a template file of said memory of said processor in response to receiving said template information from said input, said template information at least providing one of the following said architectural type number, number of said pins, and said pin assignments, storing device information corresponding to each said different architectural type in a device information file of said memory of said processor in response to receiving said device information from said input, said device information at least providing one of the following said manufacturer identity, said model number, and said price, storing available device information corresponding to selected user device information in an available device file in said memory of said processor in response to receiving said available device information from said input, said available device file selectively overriding said device information in said device information file, storing selected user constraints and weighing factors for device selection in a criteria file in said memory of said processor in response to receiving said constraints and factors from said input, said constraints defining selection limits for said device information and said weighing factors defining a cost value for said device information, identifying, via said processor, in a memory table at least one low cost solution comprising one or plurality of discrete manufactured physical logic devices in the template and device information files that implements said set of Boolean logic equations while meeting the selected user constraints in said criteria file.

2. An automated partitioning method for implementing, on a processor, a given set of Boolean logic equations to one or a plurality of discrete manufactured physical logic devices, each of said discrete manufactured physical logic devices having an architectural type number, pins, pin assignments, manufacturer identity, model number, and price, said processor having an input, a memory, and an output, said method comprising the steps of:

storing template information on different architectural types of said discrete manufactured physical logic devices in a template file of said memory of said processor in response to receiving said template information from said input, said template information including at least the architectural type number, the number of pins and the pin assignments, storing device information corresponding to each said different architectural type in a device information file of said memory of said processor in response to receiving said device information from said input, said device information including at least said identity of manufacturer, said price, device performance values, and the device logic family, storing available device information corresponding to selected user device information in an available device file in said memory of said processor in response to receiving said available device information from said input, said available device file selectively overriding said device information in said device information file, storing selected user constraints and weighing factors for device selection in a criteria file in said memory of said processor in response to receiving said constraints and factors from said input, said constraints defining selection limits for said device information and said weighing factors defining a cost value for said device information, storing selected user partitioning directives for device selection in a partitioning directives file in said memory of said processor in response to receiving said partitioning directives from said input, said partitioning directives defining predetermined physical relationships for partitioning of said Boolean logic equations, identifying, via said processor, in a memory table at least one low cost solution comprising one or plurality of discrete manufactured physical logic devices in the template and device information files that implements said set of Boolean logic equations while meeting the selected user constraints and selected user partitioning directives in said criteria and partitioning directives files.

3. An automated partitioning method for implementing, on a processor, a given set of Boolean logic equations to one or a plurality of discrete manufactured physical logic devices, each of said discrete manufactured physical logic devices having an architectural type number, pins, pin assignments, manufacturer identity, model number, and price, said processor having an input, a memory, and an output, said method comprising the steps of:

storing template information on different architectural types of said discrete manufactured physical logic devices in a template file of said memory of said processor in response to receiving said template information from said input, said template information at least providing one of the following said architectural type number, number of said pins, and said pin assignments, storing device information corresponding to each said different architectural type in a device information file of said memory of said processor in response to receiving said device information from said input, said device information at least providing one of the following said manufacturer identity, said model number, and said price, storing available device information corresponding to selected user device information in an available device file in said memory of said processor in response to receiving said available device information from said input, overriding said device information in said device information file, storing selected user constraints and weighing factors for device selection in a criteria file in said memory of said processor in response to receiving said constraints and factors from said input, said constraints defining selection limits for said device information and said weighing factors defining a cost value for said device information, storing selected user partitioning directives for device selection in a partitioning directives file in said memory of said processor in response to receiving said partitioning directives from said input, said partitioning directives defining predetermined physical relationships for partitioning of said Boolean logic equations, identifying, via said processor, in a possible solutions list in said memory, all discrete manufactured physical logic devices that have (1) a template of an architectural type wherein at least one of said Boolean logic equations in said set fits and (2) an information file wherein all said selected user constraints are met, ordering, via said processor, the discrete manufactured physical logic devices in said possible solutions list based upon said weighing factors in order of increasing cost values, fitting, via said processor, each of said equations to each of said discrete manufactured physical logic devices in said ordered list of possible solutions according to said partitioning directives, said processor generating a list of device solutions in order of increasing cost values, mapping, via said processor, said set of Boolean equations onto the discrete manufactured physical logic devices in said list of device solutions.

4. A system for selecting one or more discrete manufactured physical logic devices from a plurality of discrete manufactured physical logic devices to implement a given set of Boolean logic equations, each of said discrete manufactured physical logic devices having an architectural type number, pins, pin assignments, manufacturer identity, model number, and price, said system comprising:

a processor, said processor being receptive of said Boolean logic equations, said processor having a memory containing: a template file for storing template information on different architectural types of said devices, said template information at least providing one of the following said architectural type number, number of said pins, and said pin assignments, a device information file for storing device information corresponding to each said different architectural type, said device information at least providing one of the following said manufacturer identity, said model number, and said price and a criteria file for storing selected user constraints, said constraints defining selection limits for said device information, means in said processor for scanning said template file for all acceptable architectural types wherein at least one of said Boolean logic equations in said set fits, said scanning means being further capable of scanning said device information file for all possible discrete manufactured physical logic devices having said acceptable architectural types that fall within said selected user constraints, said processor producing a list of said possible discrete manufactured physical logic devices, means in said processor for fitting the devices in said list of possible discrete manufactured physical logic devices to said set of Boolean equations, said fitting means generating a list of device solutions, means in said processor for mapping said set of Boolean equations onto the devices in said device solutions set.

5. A system for selecting one or more discrete manufactured physical logic devices from a plurality of discrete manufactured physical logic devices to implement a given set of Boolean logic equations, each of said discrete manufactured physical logic devices having an architectural type number, pins, pin assignments, manufacturer identity, model number, and price, said system comprising:

a processor, said processor being receptive of said Boolean logic equations, said processor having a memory containing: a template file for storing template information on different architectural types of said devices, said template information at least providing one of the following said architectural type number, number of said pins, and said pin assignments, a device information file for storing device information corresponding to each said different architectural type number, said device information at least providing one of the following said manufacturer identity, said model number, and said price, a criteria file for storing selected user constraints and weighing factors, said constraints defining selection limits for said device information and said weighing factors defining cost values for said device information, means in said processor for scanning said template file for all acceptable architectural types wherein at least one of said Boolean logic equations in said set fits, said scanning means being further capable of scanning said device information file for all possible discrete manufactured physical logic devices having said acceptable architectural types that fall within said selected user constraints, said processor determining the cost values for said possible discrete manufactured physical logic devices and said processor sorting said possible discrete manufactured physical logic devices into a list of increasing cost values, means in said processor for fitting the discrete manufactured physical logic devices in said list of possible discrete manufactured physical logic devices to said set of Boolean equations, said fitting means generating a list of device solutions in order of increasing cost values, means in said processor for mapping said set of Boolean equations onto the discrete manufactured physical logic devices in said device solutions list.

6. A system for selecting one or more devices from a plurality of discrete manufactured physical logic devices to implement a given set of Boolean logic equations, each of said discrete manufactured physical logic devices having an architectural type number, pins, pin assignments, manufacturer identity, model number, and price, said system comprising:

a processor, said processor being receptive of said Boolean logic equations, a template file memory means in said processor for storing template information on different architectural types of said devices, said template information at least providing one of the following said architectural type number, said number of pins, and said pin assignments, a device information memory means in said processor for storing device information corresponding to each said different architectural type, said device information at least providing one of the following said manufacturer identity, said model number, and said price, means connected to said processor for loading into said template file memory means and into said device information memory means said template information and said device information, a criteria file memory means in said processor for storing selected user constraints and weighing factors for said device selection for said implementation, said constraints defining selection limits for said device information and said weighing factors defining cost values for said device information, means connected to said processor for inputting said selected user constraints to said criteria file memory means, means in said processor for scanning said template file memory means for all acceptable architectural types wherein at least one of said Boolean logic equations in said set fits, said scanning means being further capable of scanning said device information memory means for all possible discrete manufactured physical logic devices having said acceptable architectural types that fall within said selected user constraints, said processor determining the cost values of said possible discrete manufactured physical logic devices and said processor sorting said possible discrete manufactured physical logic devices into a list of increasing cost values, means in said processor for fitting the discrete manufactured physical logic devices in said list of possible devices to said set of Boolean equations, said fitting means generating a list of device solutions in order of increasing cost values, means in said processor for mapping said set of Boolean equations onto the discrete manufactured physical logic devices in said device solutions list.

7. A system for selecting one or more devices from a plurality of discrete manufactured physical logic devices to implement a given set of Boolean logic equations, each of said discrete manufactured physical logic devices having an architectural type number, pins, pin assignments, manufacturer identity, model number, and price, said system comprising:

a processor, said processor being receptive of said Boolean logic equations, a template file memory means in said processor for storing template information on different architectural types of said discrete manufactured physical logic devices, said template information including at least one of the following said architectural type number, the number of said pins and said pin assignments, a device information memory means in said processor for storing device information corresponding to each said different architectural type number, said device information including at least one of the following the identity of said manufacturer, said price, device performance values, and the device logic family, means connected to said processor for loading into said template file memory means and into said device information memory means said template information and said device information, an available device file memory means in said processor for storing available device information corresponding to selected user device information, said available device file memory selectively overriding said device information in said device information memory means, a criteria file memory means in said processor for storing selected user constraints and weighing factors for said device selection for said implementation, said constraints defining selection limits for said device information and said weighing factors defining a cost value for said device information, a partitioning file memory means in said processor for storing selected user partitioning directives for said device selection for said implementation, said partitioning directives defining predetermined physical relationships for partitioning of said equations, means connected to said processor for inputting said available device information to said available device file memory means, said selected user constraints to said criteria file memory means, and said partitioning directives to said partitioning file memory means, means in said processor for scanning said template file memory means for all acceptable architectural types wherein at least one of said Boolean logic equations in said set fits, said scanning means being further capable of scanning said device information memory means for all possible discrete manufactured physical logic devices having said acceptable architectural types that fall within said selected user constraints, said processor determining the cost values for said possible devices and said processor sorting said possible devices into a list of increasing cost values, means in said processor for fitting the devices in said list of possible devices to said set of Boolean equations according to said partitioning directives in said partitioning file memory means, said fitting means generating a list of device solutions in order of increasing cost values, means in said processor for mapping said set of Boolean equations onto the discrete manufactured physical logic devices in said device solutions list.

8. A system for selecting one or more devices from a plurality of discrete manufactured physical logic devices to implement a given set of Boolean logic equations, each of said discrete manufactured physical logic devices having an architectural type number, pins, pin assignments, manufacturer identity, model number, and price, said system comprising:

a processor, said processor being receptive of said Boolean logic equations, a template file memory means in said processor for storing template information on different architectural types of said devices, said template information including at least one of the following said architectural type number, the number of said pins and said pin assignments, a device information memory means in said processor for storing device information corresponding to each said different architectural type number, said device information including at least one of the following the identity of said manufacturer, said price, device performance values, and the device logic family, means connected to said processor for loading into said template file memory means and into said device information memory means said template information and said device information, an available device file memory means in said processor for storing available device information corresponding to selected user device information, said available device file memory selectively overriding said device information in said device information memory means, a criteria file memory means in said processor for storing selected user constraints and weighing factors for said device selection for said implementation, said constraints defining selection limits for said device information and said weighing factors defining a cost value for said device information, a partitioning file memory means in said processor for storing selected user partitioning directives for said device selection for said implementation, said partitioning directives defining predetermined physical relationships for partitioning of said equations, means connected to said processor for inputting said available device information to said available device file memory means, said selected user constraints to said criteria file memory means, and said partitioning directives to said partitioning file memory means, and said processor based upon said available device information, said partitioning directives, said weighing factors and said constraints selecting from said template file memory means and said device information memory means at least one low cost solution identifying said one or plurality of devices that implements said set of Boolean logic equations.

* * * * *